US009196614B2

(12) United States Patent
Kub et al.

(10) Patent No.: US 9,196,614 B2
(45) Date of Patent: Nov. 24, 2015

(54) INVERTED III-NITRIDE P-CHANNEL FIELD EFFECT TRANSISTOR WITH HOLE CARRIERS IN THE CHANNEL

(71) Applicants: Francis J. Kub, Arnold, MD (US); Travis J. Anderson, Alexandria, VA (US); Andrew D. Koehler, Alexandria, VA (US); Karl D. Hobart, Alexandria, VA (US)

(72) Inventors: Francis J. Kub, Arnold, MD (US); Travis J. Anderson, Alexandria, VA (US); Andrew D. Koehler, Alexandria, VA (US); Karl D. Hobart, Alexandria, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 14/617,510

(22) Filed: Feb. 9, 2015

(65) Prior Publication Data
US 2015/0221760 A1 Aug. 6, 2015

Related U.S. Application Data

(63) Continuation of application No. 14/169,334, filed on Jan. 31, 2014, now Pat. No. 9,006,791.

(60) Provisional application No. 61/790,591, filed on Mar. 15, 2013, provisional application No. 61/787,280, filed on Mar. 15, 2013, provisional application No. 61/789,160, filed on Mar. 15, 2013, provisional application No. 61/787,783, filed on Mar. 15, 2013.

(51) Int. Cl.
H01L 27/095 (2006.01)
H01L 29/78 (2006.01)
(Continued)

(52) U.S. Cl.
CPC .......... *H01L 27/095* (2013.01); *H01L 21/0254* (2013.01); *H01L 21/0262* (2013.01); *H01L 21/02458* (2013.01); *H01L 21/02609* (2013.01); *H01L 21/02631* (2013.01); *H01L 21/26546* (2013.01); *H01L 21/28575* (2013.01); *H01L 21/28587* (2013.01); *H01L 21/3065* (2013.01);
(Continued)

(58) Field of Classification Search
CPC ............ H01L 29/7787; H01L 29/7783; H01L 29/778; H01L 29/365; H01L 29/7784
See application file for complete search history.

(56) References Cited

U.S. PATENT DOCUMENTS 7,548,112 B2 * 6/2009 Sheppard ............ H01L 29/7787 257/289
2002/0167023 A1 * 11/2002 Chavarkar ........... H01L 29/7783 257/194

(Continued)

*Primary Examiner* — Marvin Payen
*Assistant Examiner* — Jeremy Joy
(74) *Attorney, Agent, or Firm* — US Naval Research Laboratory; Stephen T. Hunnius

(57) ABSTRACT

An inverted P-channel III-nitride field effect transistor with hole carriers in the channel comprising a gallium-polar III-Nitride barrier material, a second material layer, a two-dimensional hole gas in the second layer, and wherein the gallium-polar material comprises one or more III-Nitride epitaxial material layers grown such that when GaN is epitaxially grown the top surface of the epitaxial layer is gallium-polar. A method of making an inverted P-channel III-nitride field effect transistor with hole carriers in the channel comprising selecting a face or offcut orientation of a substrate so that the gallium-polar (0001) face is the dominant face, growing a nucleation layer, growing a gallium-polar epitaxial layer, doping the epitaxial layer, growing a barrier layer, etching the GaN, forming contacts, performing device isolation, defining a gate opening, depositing and defining gate metal, making a contact window, depositing and defining a thick metal.

15 Claims, 19 Drawing Sheets

(51) Int. Cl.

| | | |
|---|---|---|
| H01L 29/20 | (2006.01) | |
| H01L 29/66 | (2006.01) | |
| H01L 29/417 | (2006.01) | |
| H01L 29/778 | (2006.01) | |
| H01L 29/10 | (2006.01) | |
| H01L 21/285 | (2006.01) | |
| H01L 29/45 | (2006.01) | |
| H01L 29/205 | (2006.01) | |
| H01L 21/8228 | (2006.01) | |
| H01L 21/8238 | (2006.01) | |
| H01L 27/092 | (2006.01) | |
| H01L 29/04 | (2006.01) | |
| H01L 29/201 | (2006.01) | |
| H01L 29/36 | (2006.01) | |
| H01L 21/8252 | (2006.01) | |
| H01L 21/02 | (2006.01) | |
| H01L 21/265 | (2006.01) | |
| H01L 21/306 | (2006.01) | |
| H01L 21/3065 | (2006.01) | |
| H01L 21/762 | (2006.01) | |
| H01L 29/207 | (2006.01) | |
| H01L 29/16 | (2006.01) | |
| H01L 29/423 | (2006.01) | |
| H01L 29/51 | (2006.01) | |

(52) U.S. Cl.
CPC ........ *H01L 21/30612* (2013.01); *H01L 21/762* (2013.01); *H01L 21/8228* (2013.01); *H01L 21/8238* (2013.01); *H01L 21/8252* (2013.01); *H01L 27/092* (2013.01); *H01L 27/0921* (2013.01); *H01L 27/0922* (2013.01); *H01L 29/045* (2013.01); *H01L 29/1075* (2013.01); *H01L 29/201* (2013.01); *H01L 29/2003* (2013.01); *H01L 29/205* (2013.01); *H01L 29/207* (2013.01); *H01L 29/365* (2013.01); *H01L 29/41725* (2013.01); *H01L 29/41766* (2013.01); *H01L 29/452* (2013.01); *H01L 29/66431* (2013.01); *H01L 29/66439* (2013.01); *H01L 29/66462* (2013.01); *H01L 29/66477* (2013.01); *H01L 29/778* (2013.01); *H01L 29/7781* (2013.01); *H01L 29/7782* (2013.01); *H01L 29/7783* (2013.01); *H01L 29/7784* (2013.01); *H01L 29/7786* (2013.01); *H01L 29/7787* (2013.01); *H01L 29/78* (2013.01); *H01L 29/7831* (2013.01); *H01L 29/1608* (2013.01); *H01L 29/42364* (2013.01); *H01L 29/51* (2013.01)

(56) References Cited

U.S. PATENT DOCUMENTS

| | | | |
|---|---|---|---|
| 2003/0020092 A1* | 1/2003 | Parikh | H01L 29/518 257/192 |
| 2005/0133816 A1* | 6/2005 | Fan | H01L 29/7783 257/190 |
| 2007/0131970 A1* | 6/2007 | Mittereder | H01L 29/66462 257/194 |
| 2008/0296618 A1* | 12/2008 | Suh | H01L 29/1066 257/190 |
| 2009/0072269 A1* | 3/2009 | Suh | H01L 21/8252 257/136 |
| 2009/0267078 A1* | 10/2009 | Mishra | H01L 29/2003 257/76 |
| 2010/0102358 A1* | 4/2010 | Lanzieri | H01L 29/155 257/194 |
| 2010/0301395 A1* | 12/2010 | Xu | H01L 29/7784 257/194 |
| 2010/0327322 A1* | 12/2010 | Kub | H01L 29/0847 257/194 |
| 2011/0263102 A1* | 10/2011 | Heikman | H01L 29/402 438/478 |
| 2013/0320350 A1* | 12/2013 | Haberlen | H01L 21/28 257/76 |

* cited by examiner

Non-Inverted P-Channel III-Nitride transistor with hole carriers in the channel with non-spiking ohmic contacts Non-Inverted P-Channel III-Nitride transistor with hole carriers in the channel with non-spiking ohmic contacts but with source and drain conduction across the barrier layer Non-Inverted P-Channel III-Nitride transistor with hole carriers in the channel with ion implanted P-type layer Non-Inverted P-Channel III-Nitride transistor with hole carriers in the channel with spiking alloyed ohmic contacts Inverted P-Channel III-Nitride transistor with hole carriers in the channel with alloyed ohmic contact Inverted P-Channel III-Nitride transistor with hole carriers in the channel with Non alloyed ohmic contact

FIGURE 7
Simulation of Band Diagram of Inverted P-Channel III-Nitride transistor with P-type hole carrier channel
All layers are p-type doped Ga-polar III-nitride material
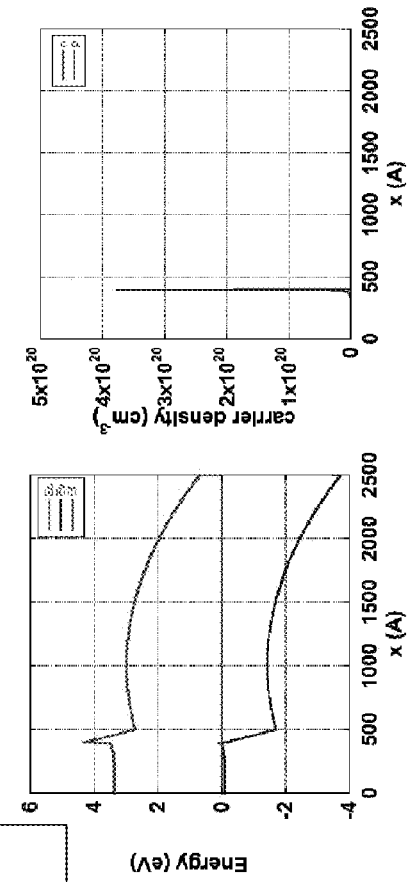
Band Simulation
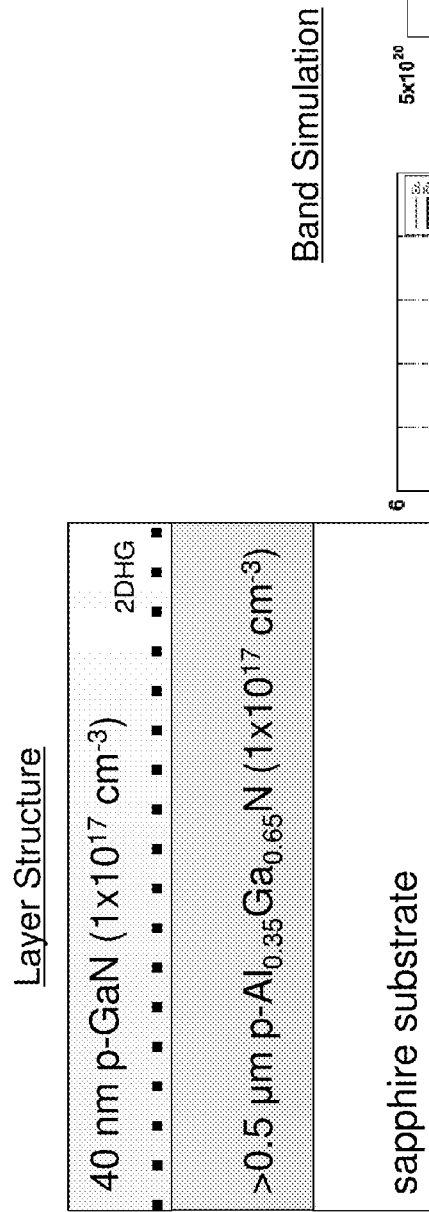
Layer Structure
40 nm p-GaN ($1 \times 10^{17}$ cm$^{-3}$) 2DHG
>0.5 µm p-Al$_{0.35}$Ga$_{0.65}$N ($1 \times 10^{17}$ cm$^{-3}$)
sapphire substrate Simulation of Band Diagram of Inverted P-Channel III-Nitride transistor with P-type hole carrier channel

FIGURE 9
Simulation of Band Diagram of Inverted P-Channel III-Nitride transistor with P-type hole carrier channel
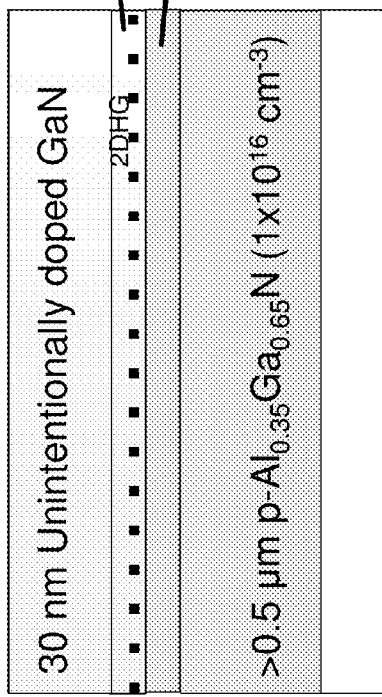
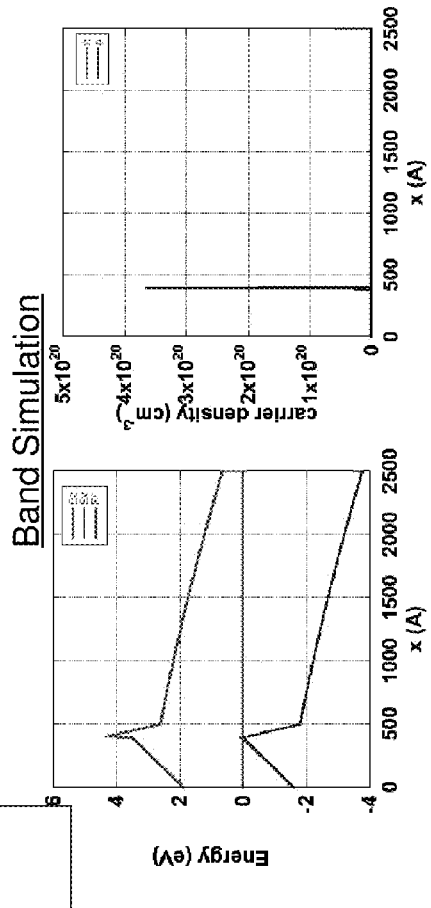

Simulation of Band Diagram of Inverted P-Channel III-Nitride transistor with P-type hole carrier channel FIGURE 11 Regrown Source drain Non-Inverted P-Channel HHMT FIGURE 12  Self-Aligned Non-Inverted P-Channel HHMT FIGURE 13  Implanted Source Drain Non-Inverted P-Channel HHMT FIGURE 15    Self-Aligned Inverted P-Channel HHMT FIGURE 16 Implanted Source Drain Inverted P-Channel HHMT FIGURE 17  Raised Source Drain Inverted P-Channel HHMT Regrown Source drain Normally-off Inverted P-Channel HHMT Simplifier Cross Section of Non-Inverted P-Channel III-Nitride transistor with P-type hole carrier channel

INVERTED III-NITRIDE P-CHANNEL FIELD EFFECT TRANSISTOR WITH HOLE CARRIERS IN THE CHANNEL

REFERENCE TO RELATED APPLICATIONS

This application is a non-provisional of, and claims priority to and the benefits of, U.S. patent application Ser. No. 14/169,334 filed on Jan. 31, 2014, U.S. Provisional Patent Application No. 61/790,591 filed on Mar. 15, 2013 and U.S. Provisional Patent Application No. 61/787,280 filed on Mar. 15, 2013 and U.S. Provisional Patent Application No. 61/789,160 filed on Mar. 15, 2013 and U.S. Provisional Patent Application No. 61/787,783 filed on Mar. 15, 2013, the entireties of each are hereby incorporated by reference.

BACKGROUND

A device of particular interest for high power and/or high frequency applications is the High Hole Mobility Transistor (HHMT), which is also known as a modulation doped field effect transistor (MODFET). These devices may offer operational advantages under a number of circumstances because a two-dimensional hole gas (2DHG) is formed at the heterointerface of two semiconductor materials with different bandgap energies, and where the smaller bandgap material has a higher electron affinity. The 2DHG is an accumulation layer in the undoped ("unintentionally doped"), smaller bandgap material and can contain a very high sheet hole concentration in excess of, for example, $10^{13}$ carriers/cm$^2$. Additionally, holes that originate in the wider-bandgap semiconductor transfer to the 2DHG, allowing a high hole mobility due to reduced ionized impurity scattering.

SUMMARY OF DISCLOSURE

Description

This disclosure describes a device structure and method of making a III-nitride P-channel field effect transistor with hole carriers in the channel with the P-type hole carrier channel being a two-dimensional hole gas (2DHG) formed at a heterointerface of two III-nitride epitaxial semiconductor materials.

The device structure can include one or more P-type doped layer(s) or region(s) within the III-nitride epitaxial layers that can generate free hole carriers that can transport to a heterointerface and form a 2DHG.

An additional embodiment is a device structure for an III-Nitride P-channel transistor with hole carriers in the channel and with P-type semiconductor in source and drain regions to supply hole carriers to a two-dimensional hole gas (2DHG).

DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings.

FIG. 7 illustrates Simulation of Band Diagram of Inverted P-Channel III-Nitride transistor with P-type hole carrier channel.

FIG. 9 illustrates Simulation of Band Diagram of Inverted P-Channel III-Nitride transistor with P-type hole carrier channel.

DETAILED DESCRIPTION OF THE INVENTION

Figure 1:
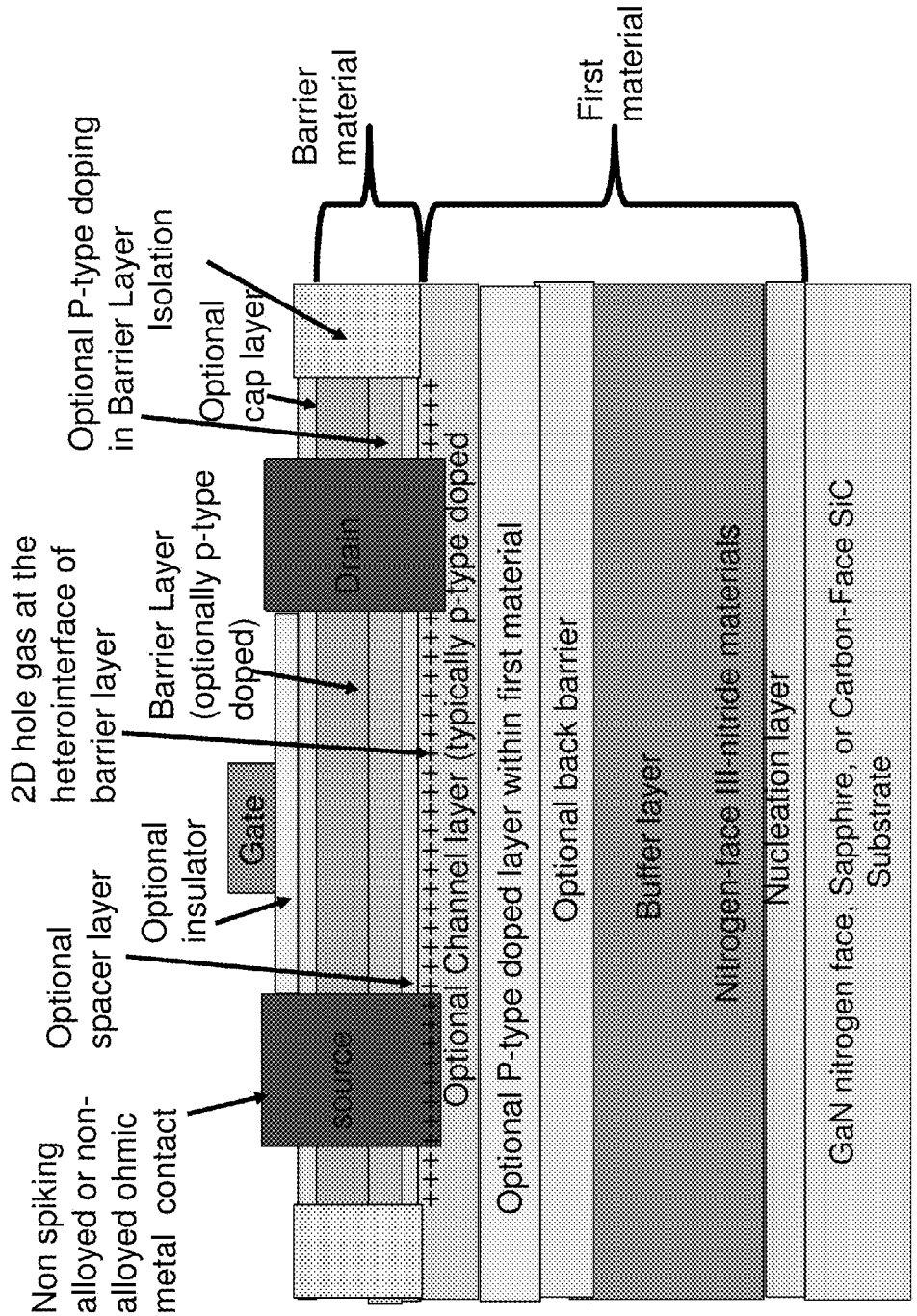
FIG. 1 illustrates Non-Inverted P-Channel III-Nitride transistor with hole carriers in the channel with non-spiking ohmic contacts.
Figure 2:
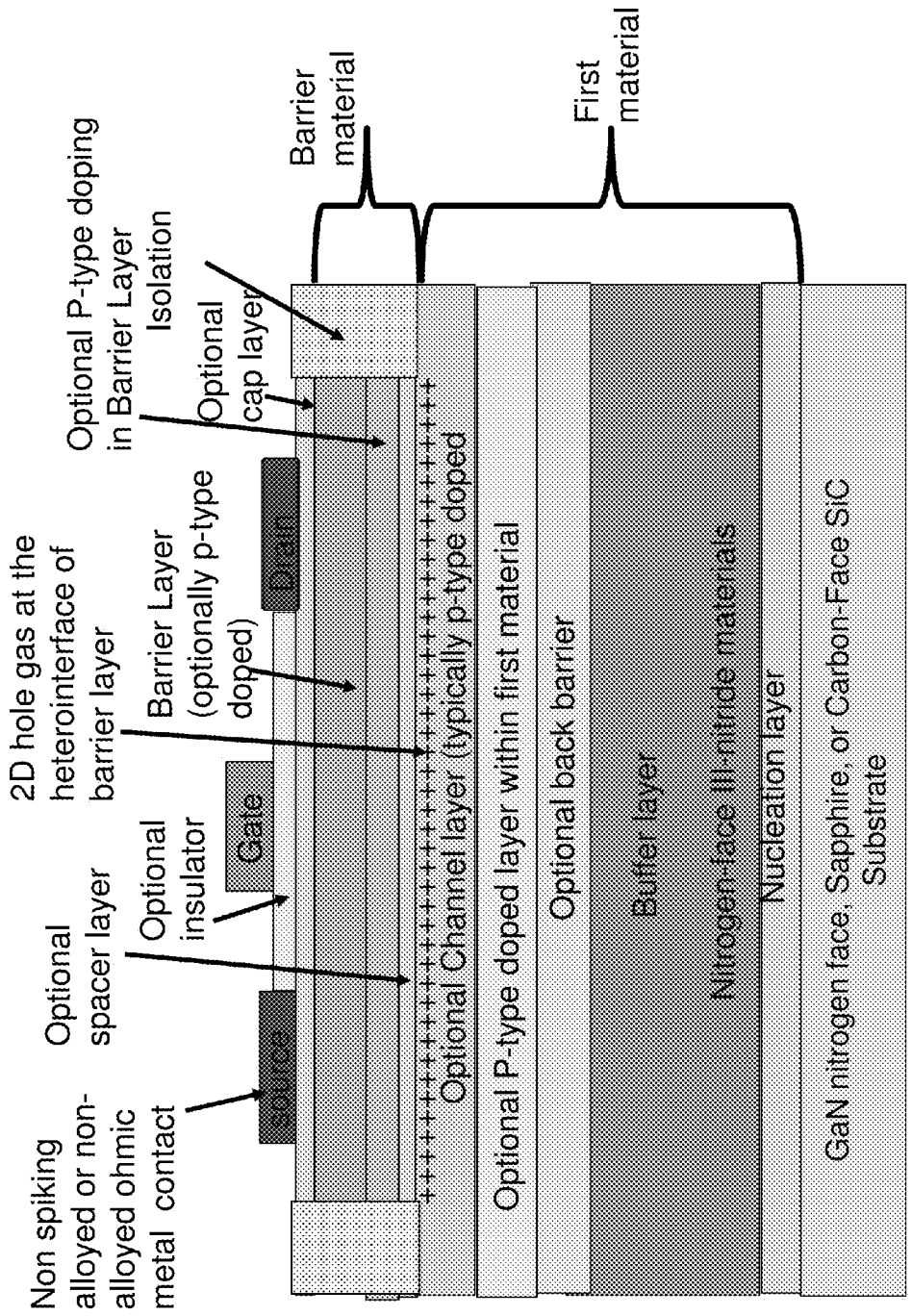
FIG. 2 illustrates Non-Inverted P-Channel III-Nitride transistor with hole carriers in the channel with non-spiking ohmic contacts but with source and drain conduction across the barrier layer.
Figure 3:
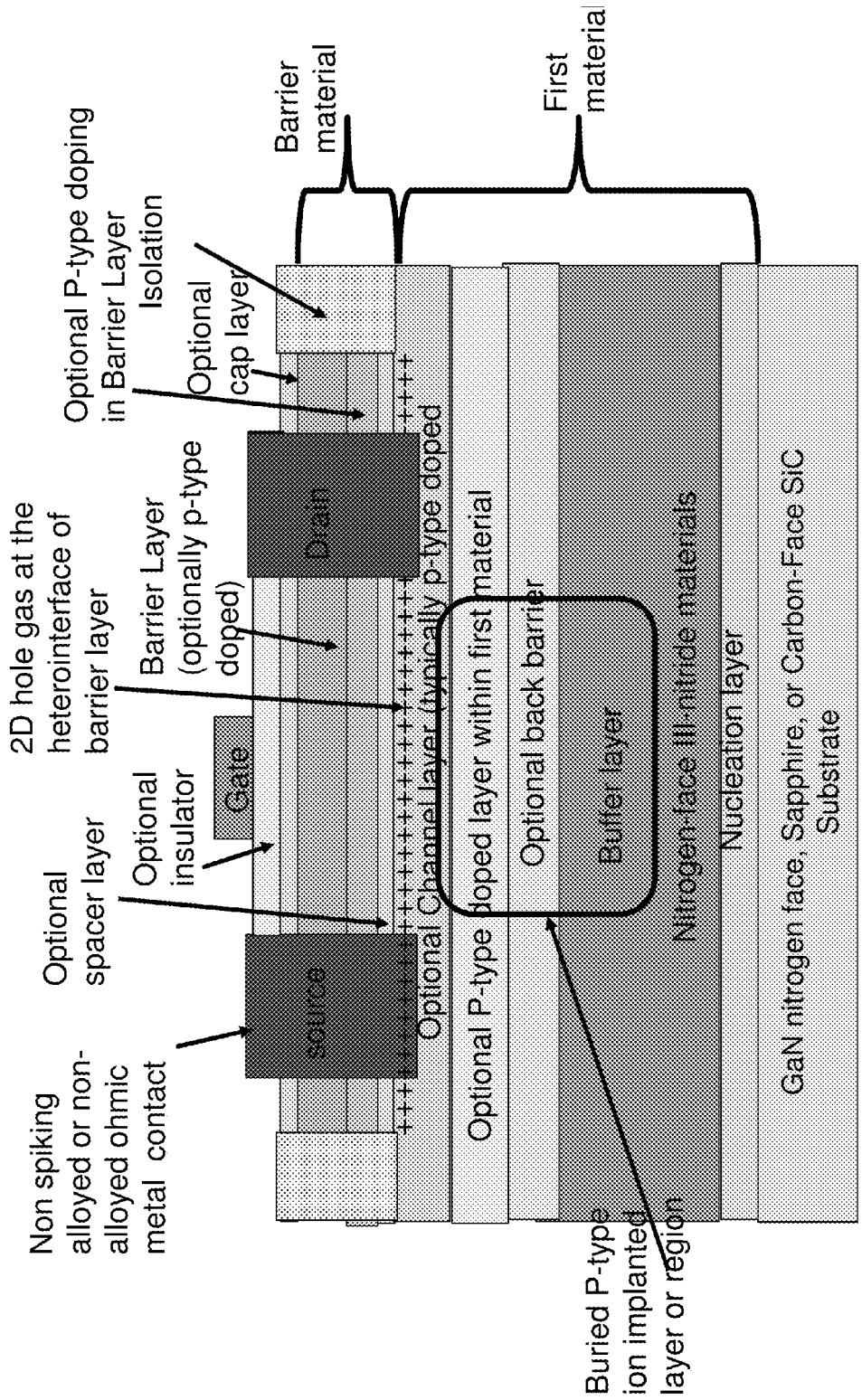
FIG. 3 illustrates Non-Inverted P-Channel III-Nitride transistor with hole carriers in the channel with ion implanted P-type layer.
Figure 4:
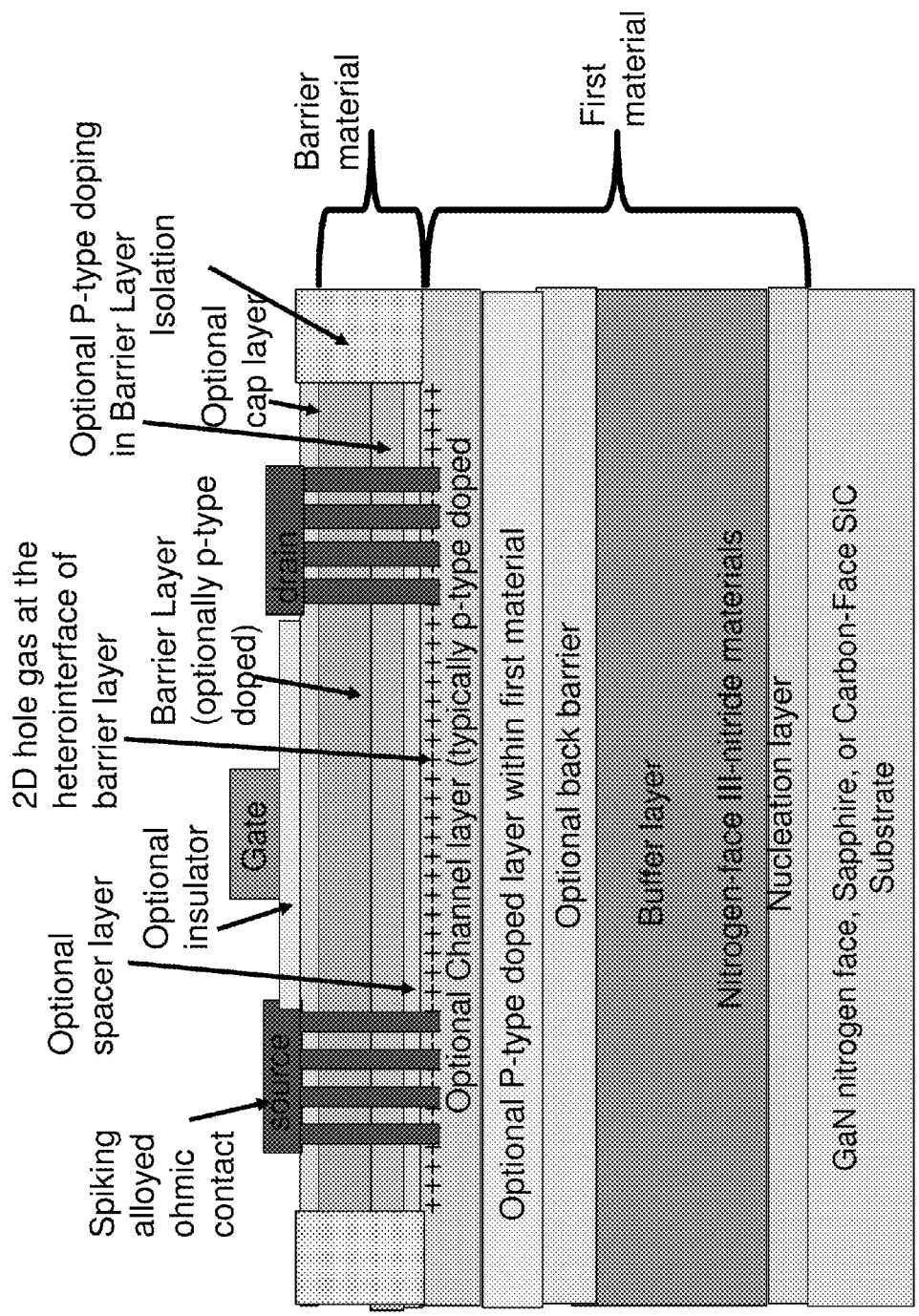
FIG. 4 illustrates Non-Inverted P-Channel III-Nitride transistor with hole carriers in the channel with spiking alloyed ohmic contacts.
Figure 5:
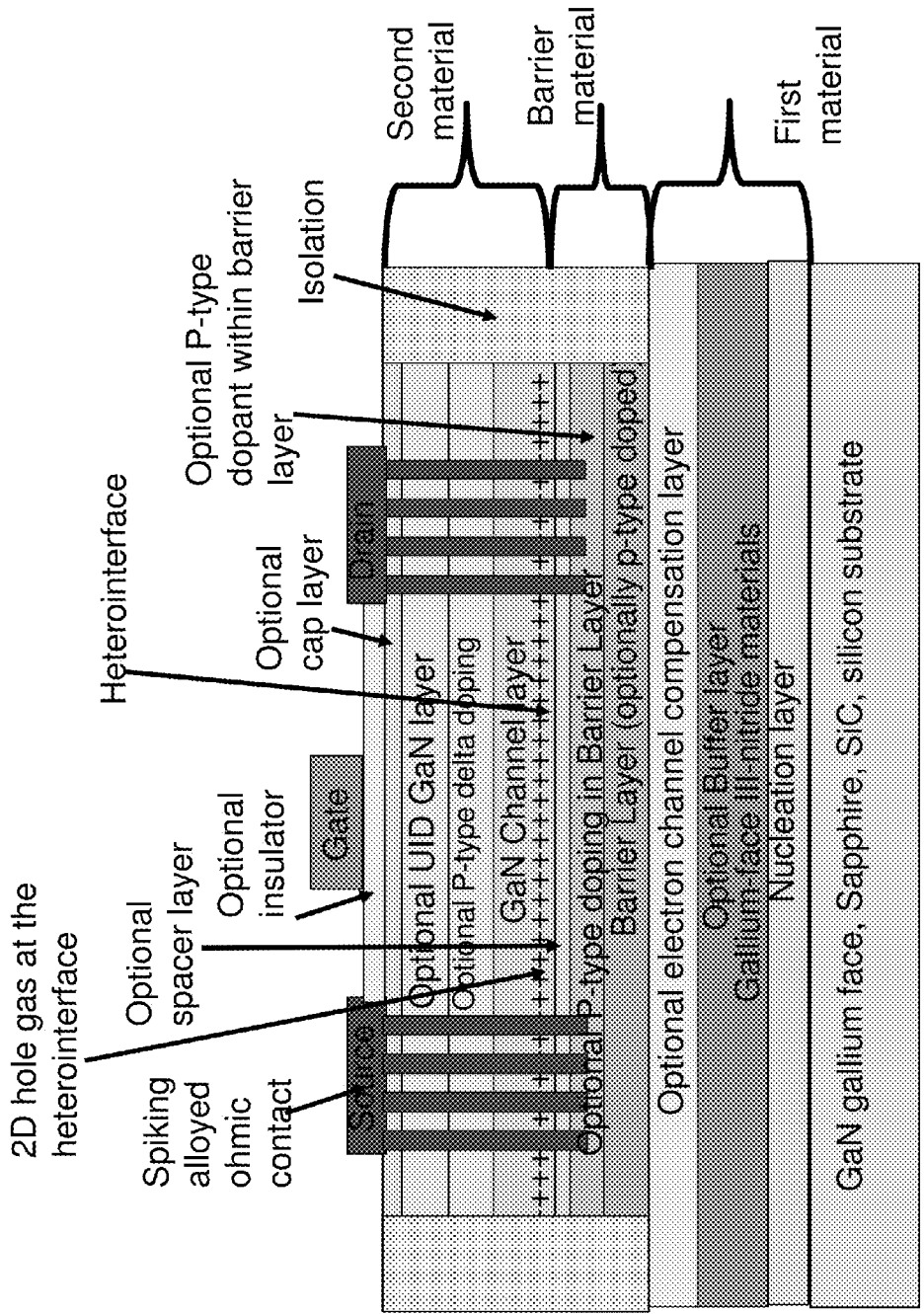
FIG. 5 illustrates Inverted P-Channel III-Nitride transistor with hole carriers in the channel with alloyed ohmic contact.
Figure 6:
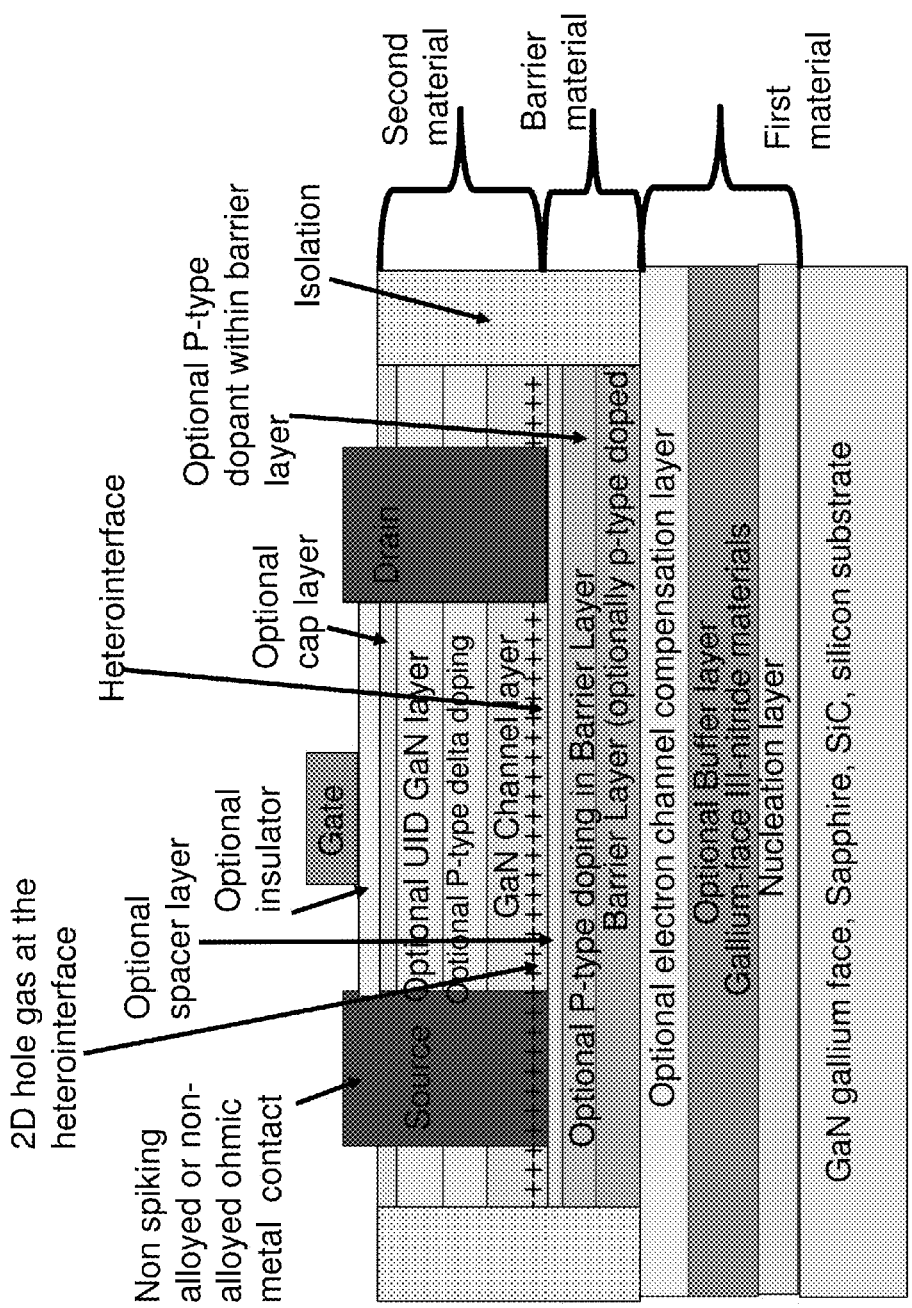
FIG. 6 illustrates Inverted P-Channel III-Nitride transistor with hole carriers in the channel with Non alloyed ohmic contact.
Figure 8:
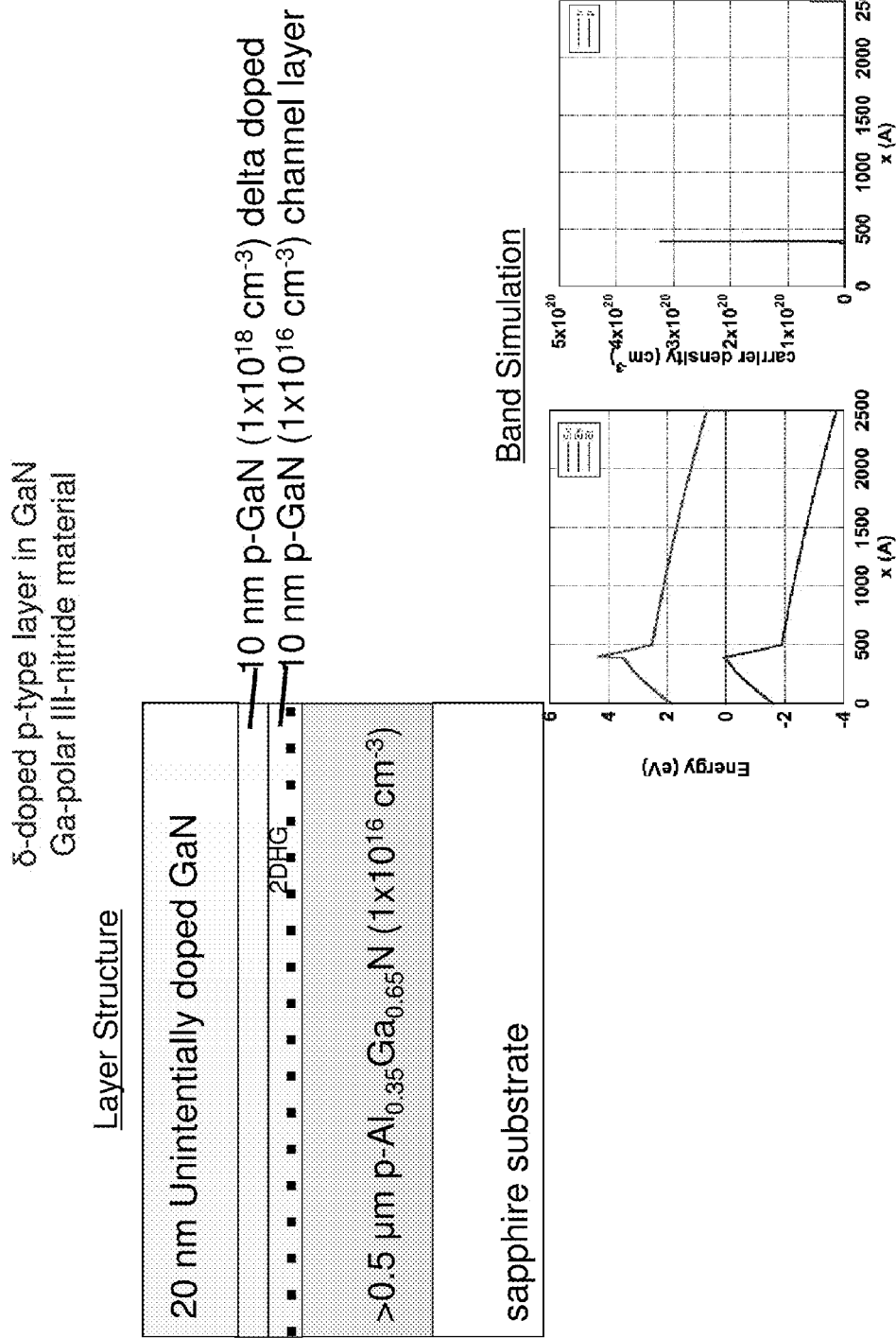
FIG. 8 illustrates Simulation of Band Diagram of Inverted P-Channel III-Nitride transistor with P-type hole carrier channel.
Figure 10:
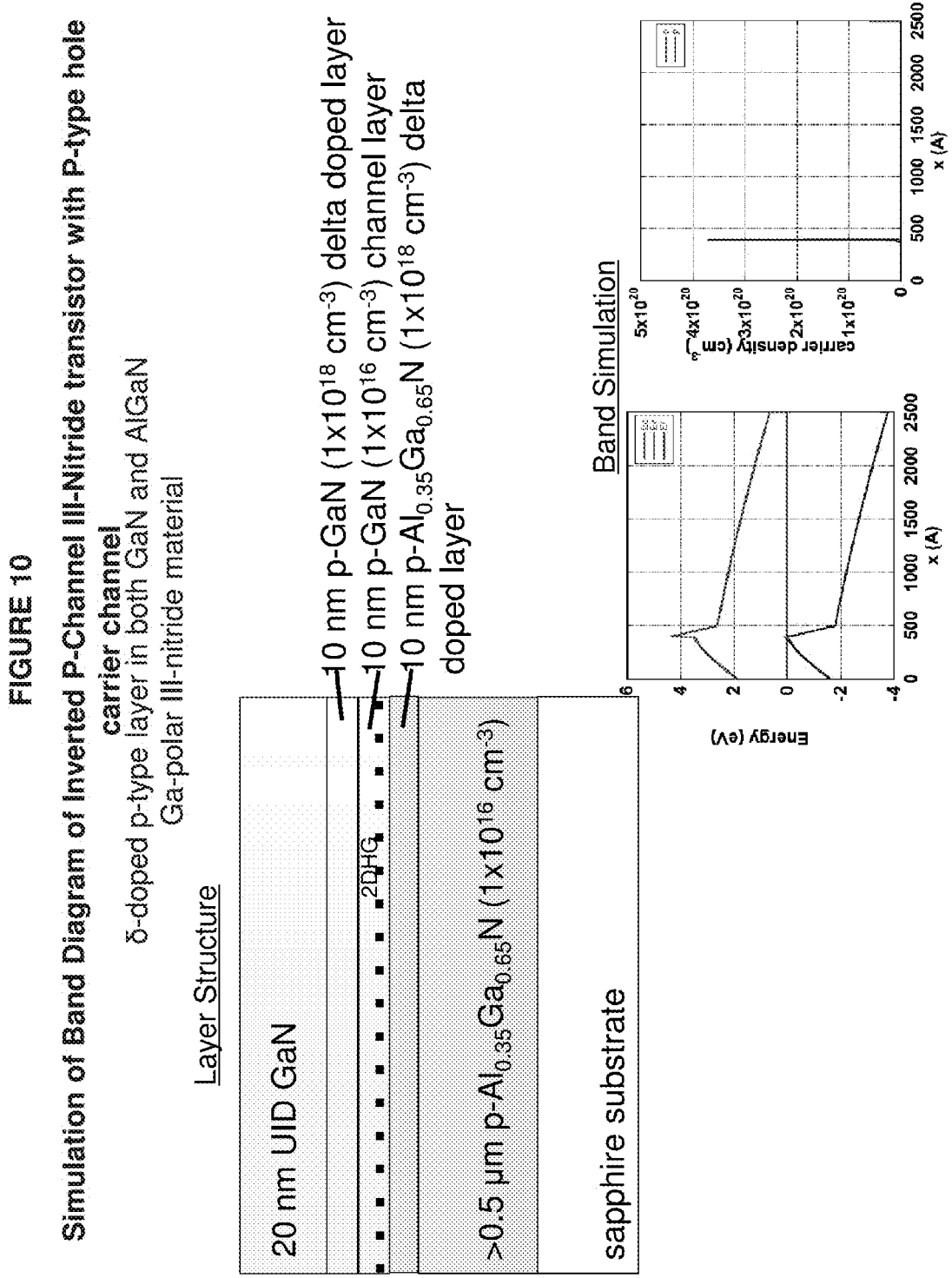
FIG. 10 illustrates Simulation of Band Diagram of Inverted P-Channel III-Nitride transistor with P-type hole carrier channel.
Figure 11:
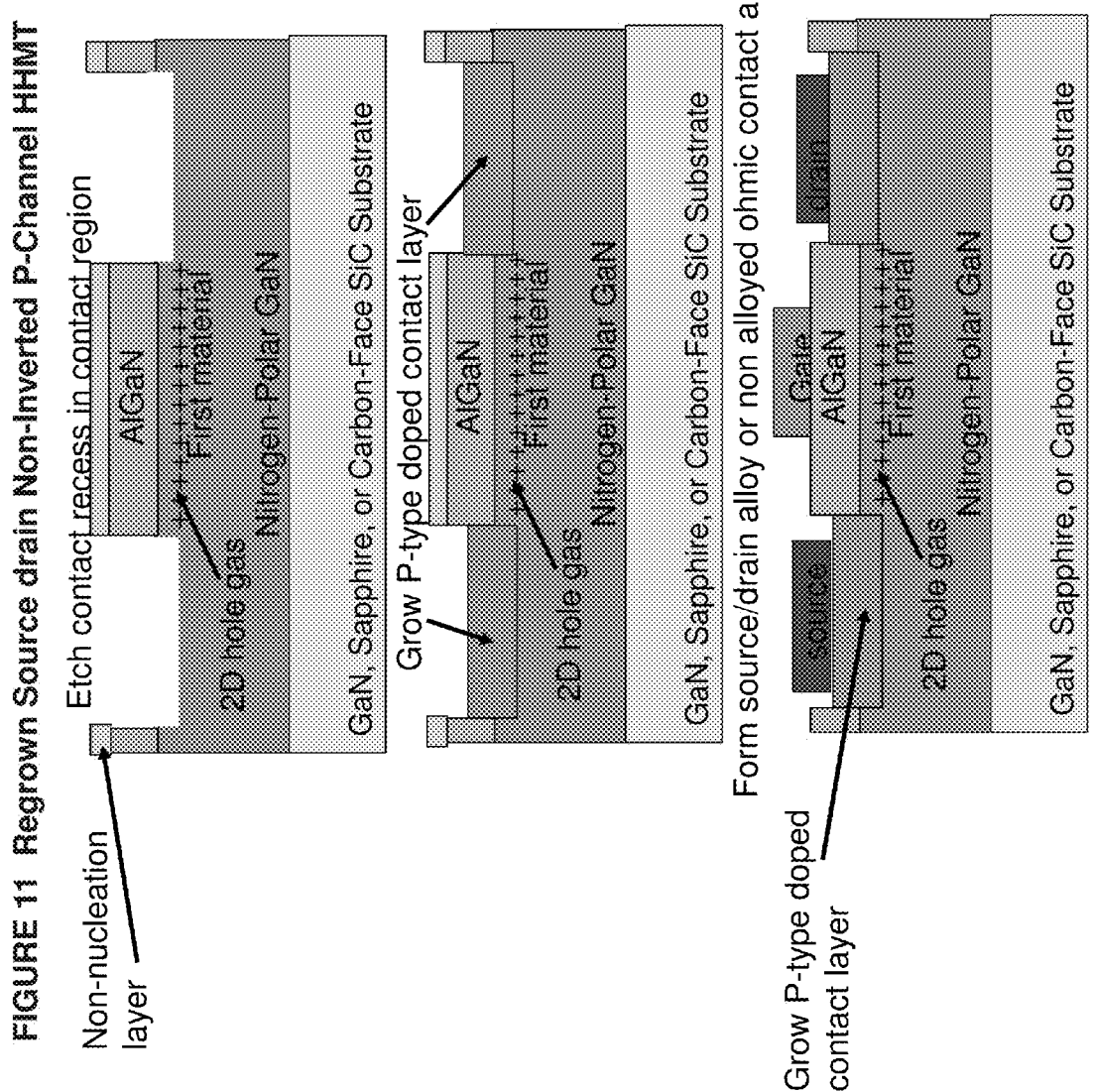
FIG. 11 illustrates Regrown Source drain Non-Inverted P-Channel HHMT.
Figure 12:
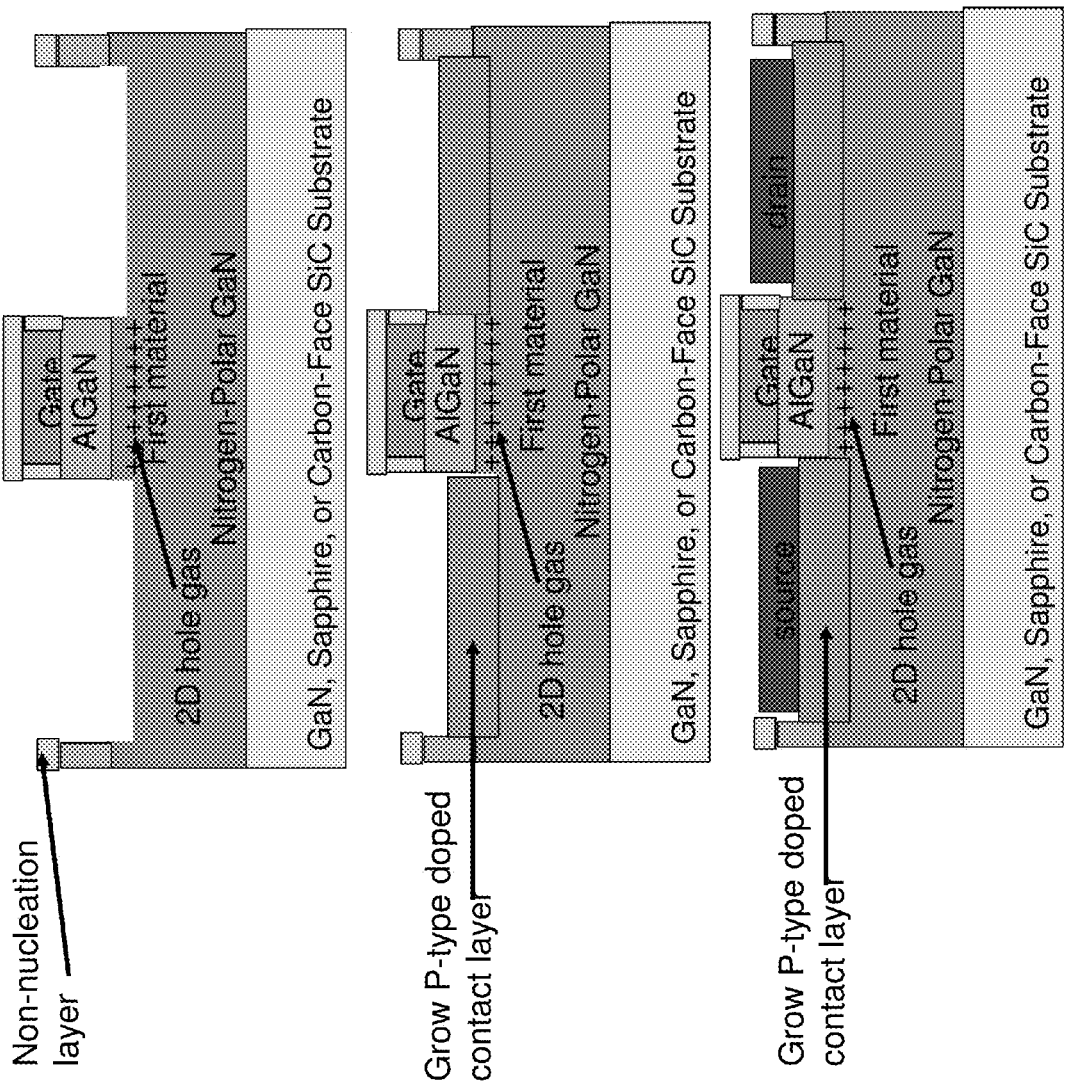
FIG. 12 illustrates Self-Aligned Non-Inverted P-Channel HHMT.
Figure 13:
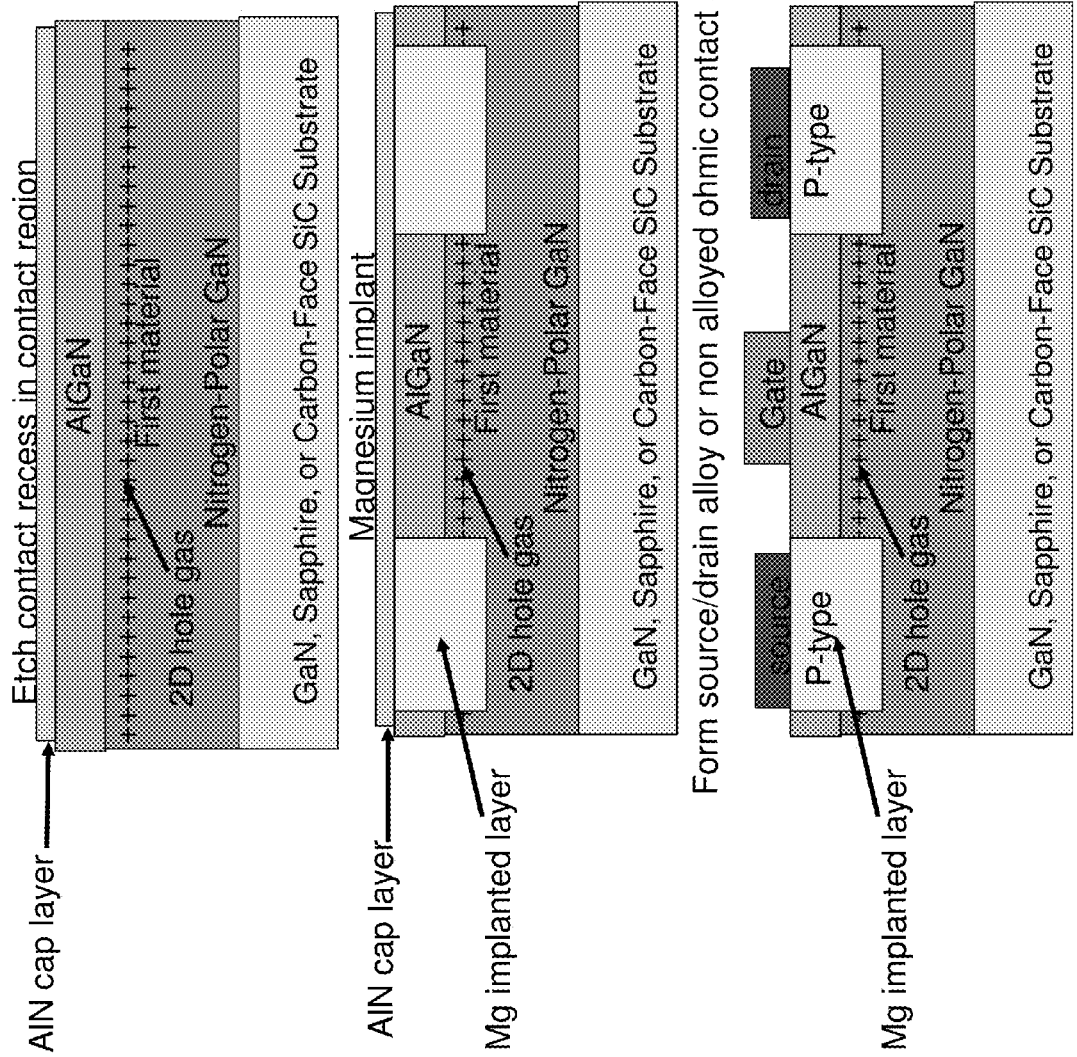
FIG. 13 illustrates Implanted Source Drain Non-Inverted P-Channel HHMT.
Figure 14:
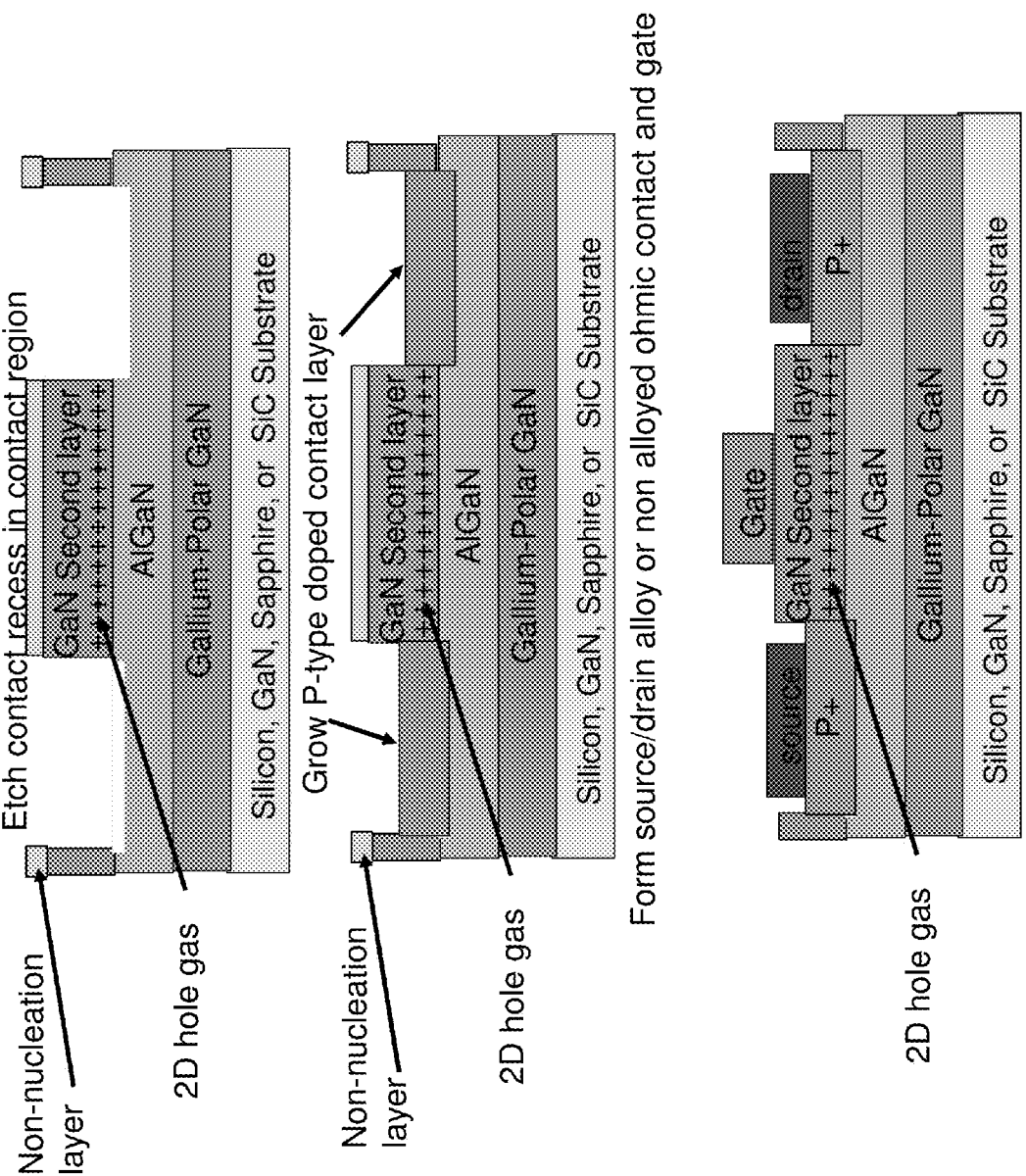
FIG. 14 illustrates Regrown Source drain Inverted P-Channel HHMT.
Figure 15:
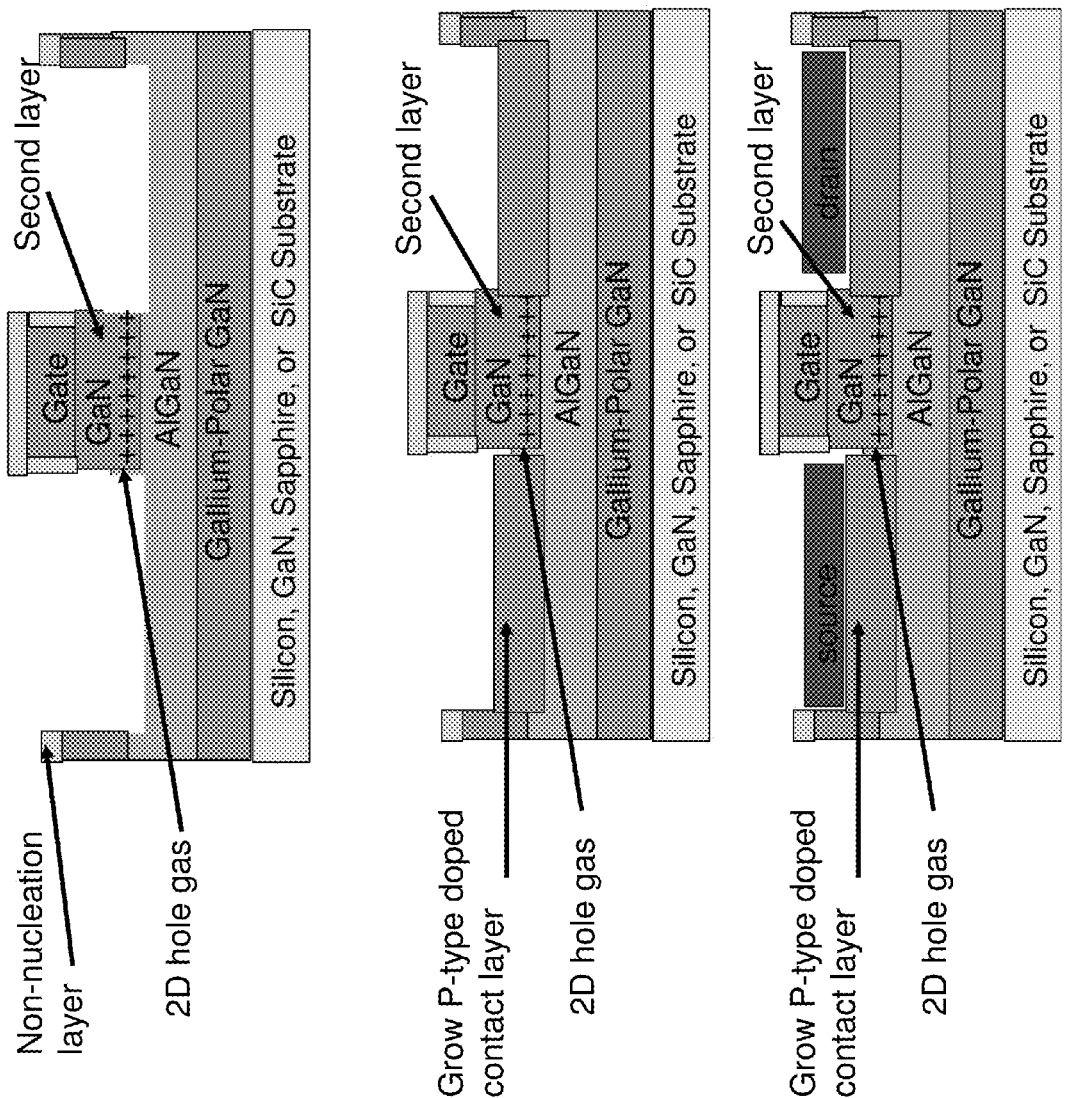
FIG. 15 illustrates Self-Aligned Inverted P-Channel HHMT.
Figure 16:
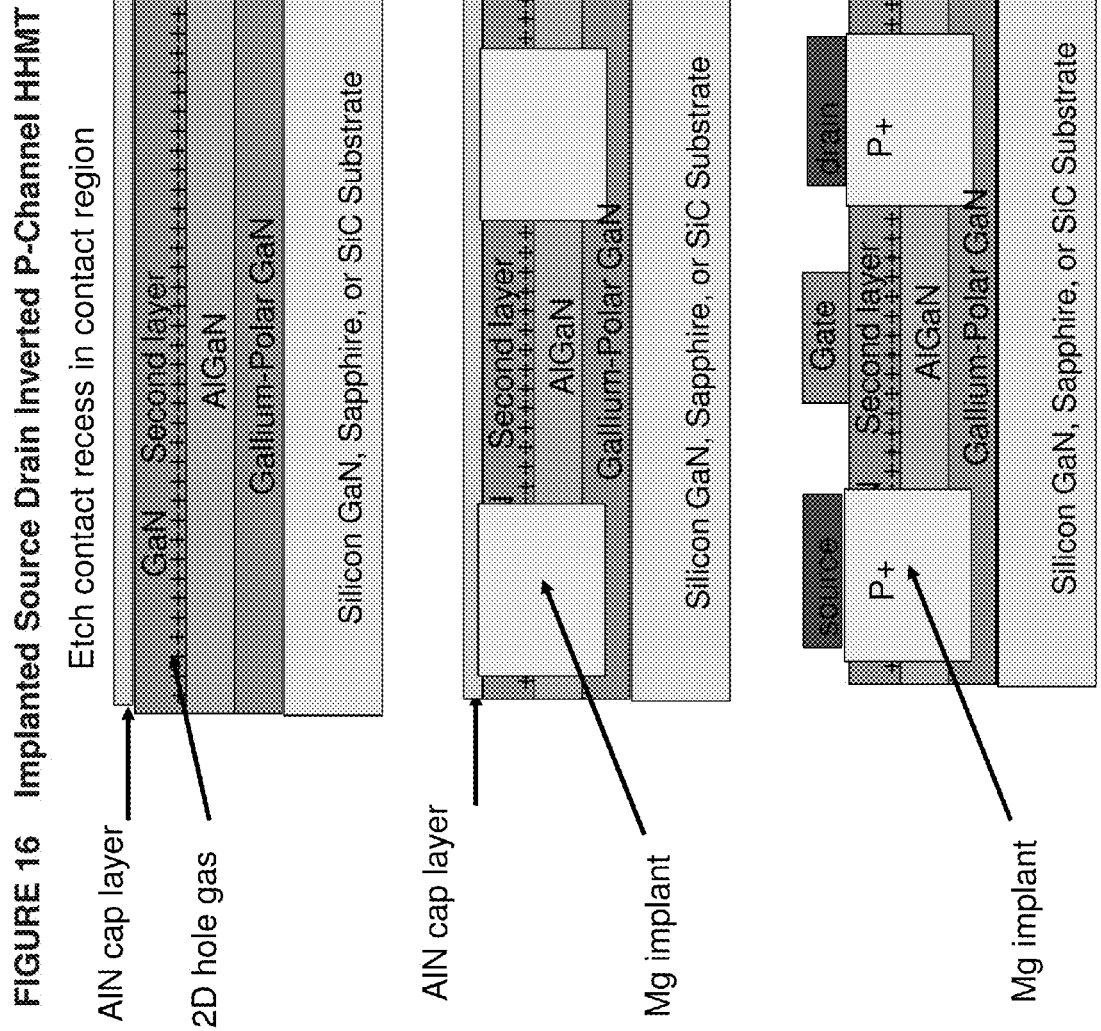
FIG. 16 illustrates Implanted Source Drain Inverted P-Channel HHMT.
Figure 17:
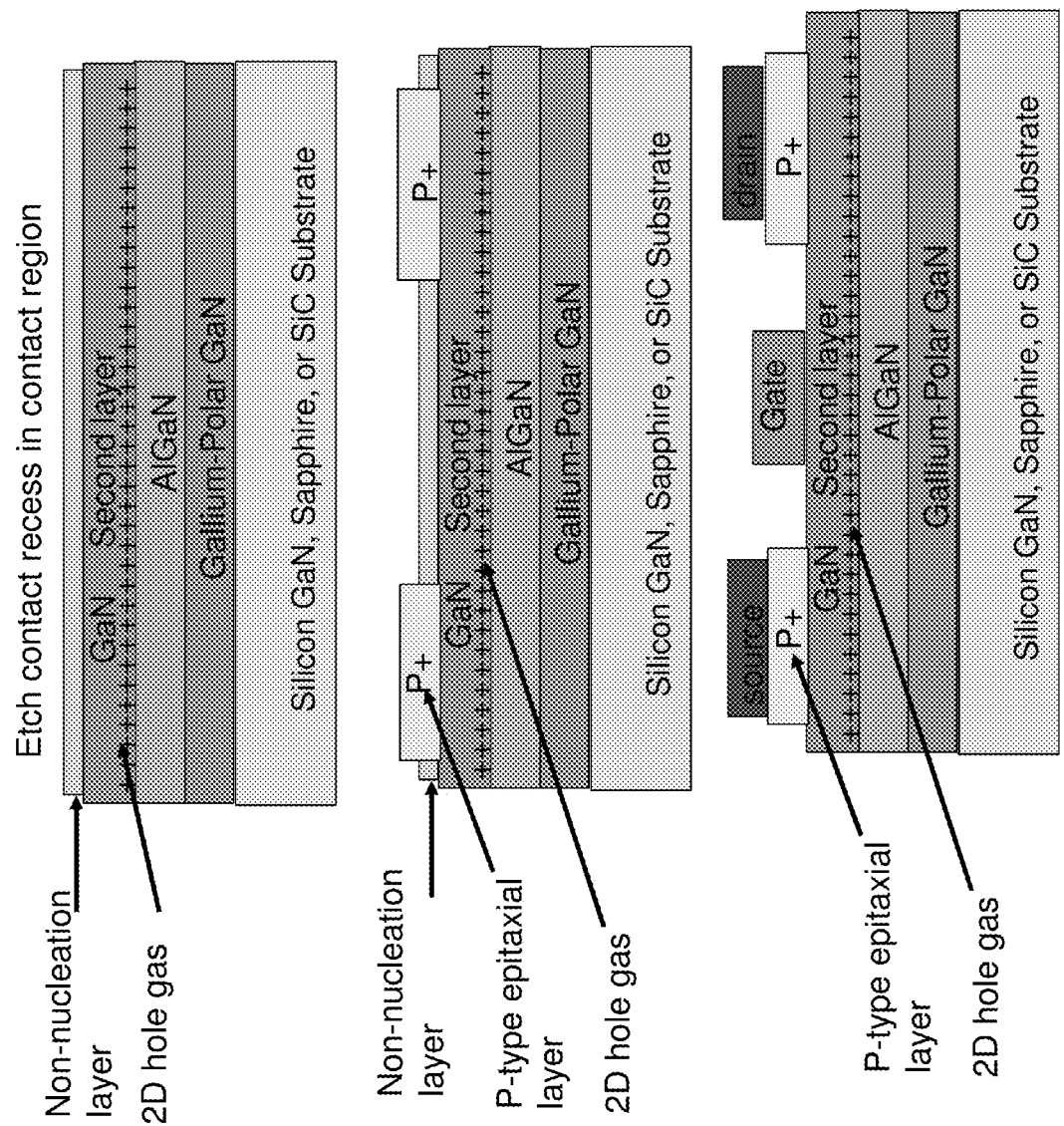
FIG. 17 illustrates Raised Source Drain Inverted P-Channel HHMT.
Figure 18:
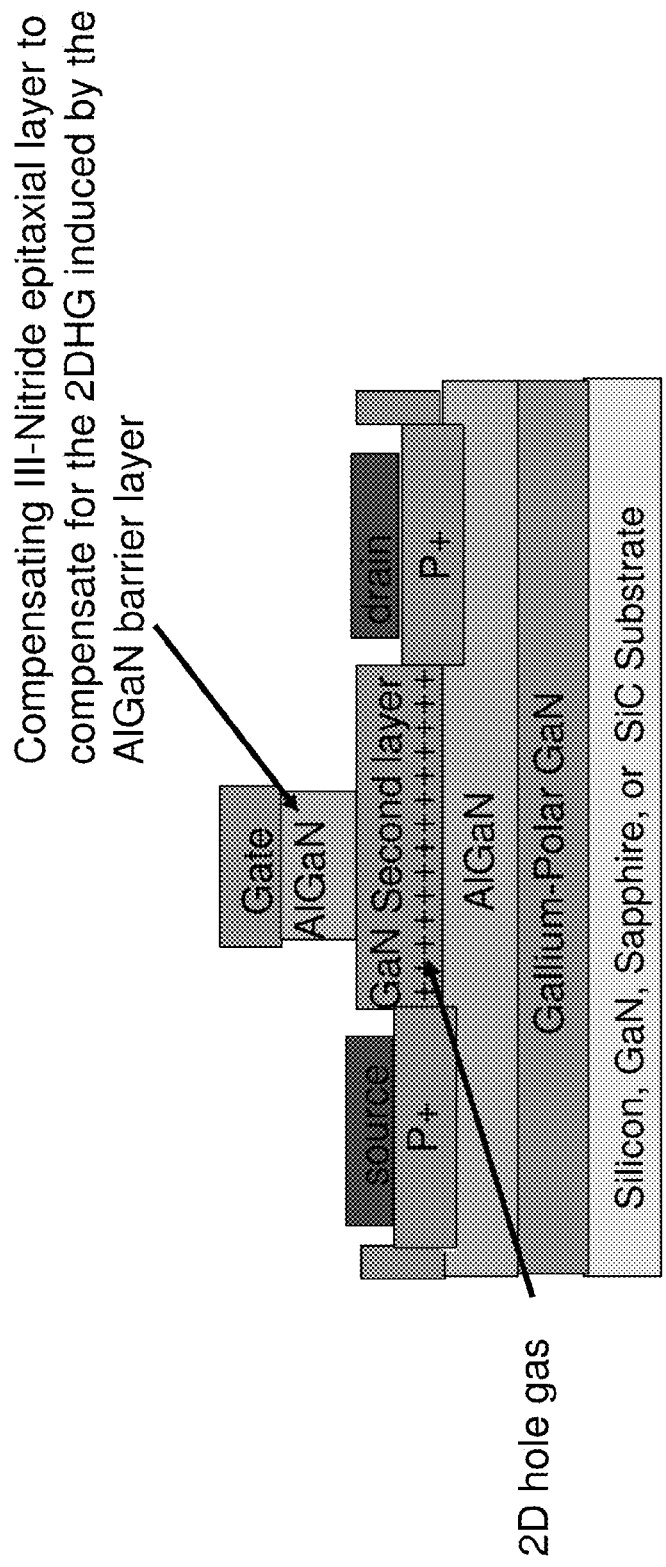
FIG. 18 illustrates Regrown Source drain Normally-off Inverted P-Channel HHMT.
Figure 19:
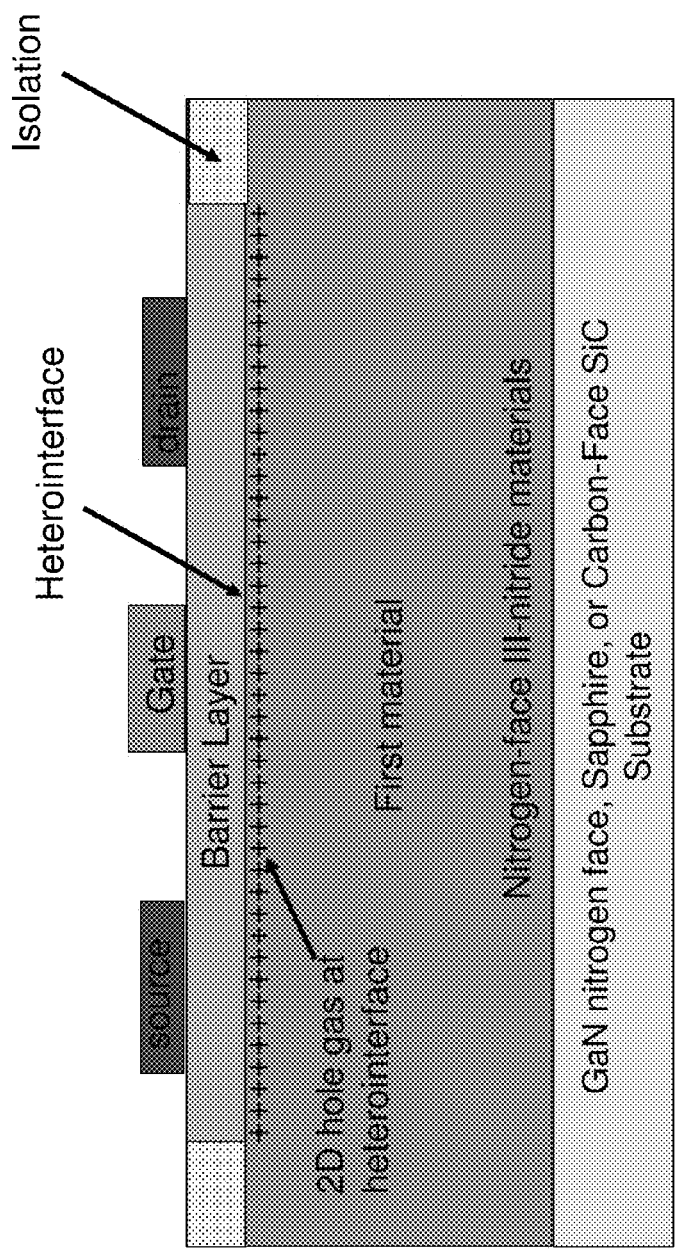
FIG. 19 illustrates Simplifier Cross Section of Non-Inverted P-Channel III-Nitride transistor with P-type hole carrier channel.

This disclosure describes a III-nitride P-channel field effect transistor with hole carriers in the channel.

Two primary types of III-Nitride HHMT are described:
  Non-inverted III-nitride transistor with P-type hole carrier channel, including Non-Inverted P-channel High Hole Mobility Transistor and
  Inverted III-nitride transistor with P-type hole carrier channel, including Inverted P-channel High Hole Mobility Transistor.

A normally-off III-nitride P-channel field effect transistor with hole carriers in the channel can be used along with a normally-off III-Nitride N-channel transistor with electron carriers in the channel to implement complementary transistor circuitry that has significant advantages for low power switching and high voltage operation because of the high critical breakdown field of III-nitride semiconductor materials compared to silicon semiconductor material.

Unintentionally doped III-nitride material often has a N-type doping.

III-Nitride material layer: III-nitride material layer refers to a compound semiconductor formed from the elements indium, aluminum, gallium, or nitrogen that includes at least nitrogen and another alloying element from group III. Examples of III-nitride compound semiconductors are gallium nitride (GaN), aluminum nitride (AlN), aluminum gallium nitride (AlGaN), indium nitride (InN), indium gallium nitride (InGaN), indium aluminum nitride (InAlN), indium aluminum gallium nitride (InAlGaN), or any combination of elements that includes nitrogen and at least one element from group III.

Gallium-polar: gallium-polar (gallium-face) material having a gallium polar (gallium-face) surface, typically grown on the Ga-polar (000-1) face of GaN of the wurtzite-phase material.

Nitrogen-Polar: nitrogen-polar (nitrogen-face) material having a nitrogen polar (nitrogen-face) surface, typically grown on the nitrogen-polar (000-1) face of GaN.

III-Nitride barrier material: The III-Nitride barrier material can comprise one or more III-Nitride epitaxial layer(s) and one or more P-type doped layer(s). The III-Nitride epitaxial layers in the barrier layer can have different functions. For example, a barrier epitaxial layer, along with the epitaxial layers that make up the first material or second material, can be selected to induce spontaneous polarization and/or piezoelectric polarization at a heterointerface that can enhance or reduce the carrier density of hole carriers in the two-dimensional hole gas. Another epitaxial layer that can be within the barrier layer can be a thin III-Nitride spacer layer such as a 1 nm thick AlN spacer (adjacent to barrier layer and between the 2DHG and the a ternary or quandary III-nitride epitaxial barrier layer material) to minimize the alloy scattering of hole carriers in the two-dimensional hole gas. Another type of epitaxial layer in the barrier layer is an epitaxial layer that can serve as an etch stop layer. The two-dimensional hole gas will be in the III-Nitride first material layer at the heterointerface of an III-Nitride barrier layer and an III-Nitride first material in the case of a non-inverted III-nitride transistors with p-type hole carrier channel, or in the III-Nitride barrier layer at the heterointerface of an III-Nitride barrier layer and an III-Nitride second material in the case of an inverted III-nitride transistors with p-type hole carrier channel. The barrier epitaxial layers can also be doped with one or more layers of P-type dopant such as magnesium to aid in providing hole carriers to the two-dimensional hole gas (2DHG). The P-type doped layer can be a delta doped P-type layer which can be a thin, high doping concentration P-type doped layer within the barrier layer. The P-type doped layer within the barrier material can be displaced from the heterointerface a selected distance to reduce the effect of ionized impurity scattering from the presences of the P-type dopant atoms on the mobility of hole carriers within the 2DHG. The III-Nitride epitaxial barrier layer(s) will typically be selected from the group of III-Nitride material such as GaN, AlN, AlGaN, InAlN, and AlInGaN. The III-nitride epitaxial barrier layer can be selected to be tensile strained, compressive strained, or unstrained to optimize the hole carrier density within the 2DHG. The III-Nitride first material or second material that is adjacent to the III-Nitride epitaxial barrier layer can be typically selected from the group of GaN, InN, or InGaN but the first material or second material layers can also include AlGaN, InAlN, InAlN epitaxial layer(s). The channel layer can also be doped with P-type dopant to aid in supplying free holes to the two dimensional hole gas. The compound semiconductor layers in the barrier layer are typically N-type but can have one or more P-type compound semiconductor layers within the first material.

Channel layer: An optional epitaxial channel layer can be included in the device structure. The channel layer can be selected to have a P-type doping concentration that is lower then P-type doping concentration for other layers or regions within the first material or second material so that there is reduce neutral impurity scattering of the hole carriers. The epitaxial channel layer can be selected to be unintentionally doped (UID) III-nitride epitaxial layer. The channel layer will be typically adjacent to the barrier layer within the first material for the non-inverted P-channel III-nitride transistor or within the barrier layer adjacent to the first material for an inverted P-channel III-nitride transistor.

First material: A first material is comprised of one or more III-nitride epitaxial layers that are disposed above the substrate in at least the gate, and portions of the source or drain region of the P-channel field effect transistor and makes a heterointerface with the bottom side of the barrier layer (the side of the barrier layer that is closest to the substrate). The III-nitride epitaxial layers in the first material if they are unintentionally doped (UID) are typically N-type. The first material can have one or more P-type doped layers or regions within any of the III-nitride epitaxial layers that comprise the first material including delta doped P-type layers or ion implanted P-type regions. The epitaxial layers in the first material can be selected to be relaxed or strained to optimize the 2DHG. The first material can comprise III-nitride epitaxial layers that can be nucleation layer, buffer layer, back barrier layer, channel layer and can have undoped (unintentionally doped) regions, P-type doped layers, P-type doped regions, or doped regions that compensate the unintentionally doped N-type III-nitride layers to convert the layer to a P-type layer.

Cap layer: A III-nitride cap layer such as a thin GaN epitaxial layer can be selected to optimize the surface properties of the III-nitride epitaxial layers for optimized passivation properties (such as reduced current collapse) or to optimize the III-nitride material contact with a Schottky gate metal.

Second material: A second material is comprised of one or more III-nitride epitaxial layers that are disposed above barrier layer in at least the gate region, and portions of the source or drain region of the P-channel field effect transistor and makes a heterointerface with the top side of the barrier layer (the side of the barrier layer that is farthest from the substrate). The III-nitride epitaxial layers in the second material if they are unintentionally doped (UID) are typically N-type. The second material can have one or more P-type doped layers or regions within any of the III-nitride epitaxial layers that comprise the second material including delta doped P-type layers or ion implanted P-type regions. The epitaxial layers in the second material can be selected to be relaxed or strained to optimize the 2DHG. The second material can comprise III-nitride epitaxial layers that can be channel layer, unintentionally doped layer, strained layers to minimize polarization to aid in achieving normally-off operation, and can have P-type doped layers, P-type doped regions, or doped regions that compensate the unintentionally doped N-type III-nitride layers to convert the layer to a P-type layer.

P-type semiconductor contact layer: P-type semiconductor material in the source and drain region that makes a connection to the 2DHG. The P-type semiconductor in the source and drain region are contacted metal electrodes in the source and drain regions.

Contact region: A region beneath the source and drain metal electrodes that contains P-type semiconductor contact layer material that makes an electrical connection between source and drain metal and the 2DHG.

This disclosure describes a device structure and method of making a P-channel III-nitride transistor with hole carriers in the channel with the hole carriers being in a two-dimensional hole gas (2DHG) formed at a heterointerface of two III-nitride semiconductor materials.

The device structure can include one or more P-type doped layer(s) or region(s) that can generate free hole carrier that can transport to the heterointerface and form a 2DHG.

The P-type doped layers can aid optimizing the band diagram within the material that so that the valence band maximum at the heterointerface where the 2DHG is located is at a potential that is higher than the quasi-fermi level for zero bias applied to the gate electrode.

The differences or additions of the spontaneous and piezoelectric polarization in the III-nitride epitaxial layers, and especially the adjacent III-nitride epitaxial layers, can aid in optimizing the carrier density in the 2DHG.

The III-nitride epitaxial layers can be selected to have either tensile, compressive, or no strain to optimize the carrier density in the 2DHG.

The work function of the gate electrode can be selected to optimize the P-channel field effect transistor threshold voltage.

The fixed charge in an insulator can be selected to optimize the P-channel field effect transistor threshold voltage.

Certain embodiments of the present invention include, but are not limited to an III-nitride transistor with P-type hole carrier channel is an III-Nitride High Hole Mobility Transistor (HHMT).

An additional embodiment is Modulation doped High Hole Mobility Transistor.

An additional embodiment is an insulated gate High Hole Mobility Transistor.

An additional embodiment is a Heterojunction Insulated Gate High Hole Mobility Transistor.

An additional embodiment is a device structure for an III-Nitride transistor with P-type hole carrier channel and with P-type semiconductor in source and drain regions to supply hole carriers to a two-dimensional hole gas (2DHG).

In some embodiments of the P-channel III-nitride field effect transistor free hole carriers can be generated within the device structure by incorporating P-type dopant layer(s) or region(s).

The one or more P-type dopant hole generation layer(s) or region(s) can be incorporated that allows the generation of free hole carrier that can then transport to a two-dimensional hole gas (2DHG) at the heterointerface of two III-nitride semiconductor materials.

An III-nitride transistor with a doped hole generation layer(s) or region(s) is sometimes known as a modulation doped field effect transistor (MODFET).

A two-dimensional hole gas (2DHG) can be formed at the heterointerface of two semiconductor materials with different bandgap energies and/or polarization. The different polarizations in the two semiconductor materials can induce a 2DHG at the heterointerface of the two semiconductor materials. The heterointerface allows a high hole mobility due to reduced ionized impurity scattering. The smaller bandgap material will typically have a larger high electron affinity then the wide bandgap material. The 2DHG is a carrier layer at the heterointerface of the smaller bandgap material with the wider bandgap material and can contain a very high sheet hole concentration in excess of, for example, $10^{13}$ carriers/cm$^2$.

Two primary types of III-Nitride HHMT are described:
Non-inverted III-nitride transistor with P-type hole carrier channel, including Non-Inverted P-channel High Hole Mobility Transistor and
Inverted III-nitride transistor with P-type hole carrier channel, including Inverted P-channel High Hole Mobility Transistor.

For the above inverted and non-inverted III-Nitride transistors with P-type hole carrier channel, there are additional variations of the disclosed structures including:
Confined epitaxial growth for non-inverted III-nitride transistor with P-type hole carrier channel (including Inverted P-channel High Hole Mobility Transistor)
Enhancement mode device structure (Normally-off device structure)
Depletion mode device structure (Normally-on device structure)
Epitaxial grown low P-type doping concentration channel layer
Epitaxial grown delta doped hole carrier generation layer
Epitaxial grown doped hole carrier generation layers that have P-type dopant throughout the epitaxial layer
Implanted doped hole carrier generation regions
High Hole Mobility Transistor with Insulated gate
High Hole Mobility Transistor with recessed channel region
Epitaxial grown P-type semiconductor in the source and drain ohmic contact regions
Grown P-type polycrystalline semiconductor in source and drain contact regions
P-type implanted dopant in the source and drain contact regions
Grown raised source and drain contact regions
Heterojunction source and drain contact regions
Self-aligned source/drain contact regions
Alloyed ohmic contact region
Non-alloyed ohmic contact regions Example 1

Non-Inverted (Normal) P-Channel III-Nitride High Hole Mobility Transistors

In a first device structure embodiment, Non-Inverted P-channel III-nitride field effect transistor with hole carriers in the channel are fabricated on a nitrogen-polar (nitrogen face) III-Nitride material grown epitaxially on a substrate.

For the purposes of this disclosure, non-inverted means that the two-dimensional hole gas at the heterointerface is on the side of the barrier material layer that is closest to the substrate (bottom side of the barrier layer).

The Non-inverted P-channel III-nitride transistor with hole carriers in the channel can be a P-channel III-Nitride High Hole Mobility Transistors.

The nitrogen-polar III-Nitride first material can comprise of one or more III-Nitride epitaxial material layers grown in such a manner that when GaN is epitaxially grown (and other III-Nitride epitaxial layers), the top surface of the epitaxial layer is nitrogen-polar (nitrogen-face).

The substrate can be selected for optimizing the epitaxial growth of nitrogen-polar III-Nitride epitaxial layers. For example, a carbon-face SiC substrate is known to facilitate the growth of nitrogen-polar III-Nitride epitaxial layers. A sapphire substrate without an AlN buffer can be used to grow nitrogen polar III-Nitride epitaxial layers. A gallium nitride bulk substrate can be used with the nitrogen-polar surface can be selected for epitaxial growth of the nitrogen-polar III- Nitride epitaxial layers. There are other substrates known to those skilled in the art that can be selected to grow nitrogen polar III-nitride epitaxial layers.

The Non-Inverted P-channel III-Nitride High Hole Mobility Transistors will have a two-dimensional hole gas (2DHG) at a heterointerface on the bottom side (side of the barrier layer closest to the material substrate) of a barrier layer. The 2DHG will be at the heterointerface of a barrier material layer and a first material and is located on bottom side of the barrier layer. The P-type doped layers can aid optimizing the band diagram within the III-nitride material so that the valence band maximum at the heterointerface where the 2DHG is located is at a potential that is higher than the quasi-Fermi level for zero bias applied to the gate electrode.

There can be optional P-type dopant hole carrier generation layer(s) or region(s) such as III-nitride material doped with magnesium incorporated within the entire first material, as one or more delta doped P-type layer(s) within first material, partially within one or more of the epitaxial layers within the first material, or entirely within one of the epitaxial layers within the first material, or ion implanted P-type regions.

The P-type dopant hole generation layer performs as a modulation-doping source to aid in providing (generating) free hole carriers that transport to the two-dimensional hole gas.

The first material can consist of one or more III-nitride epitaxial layers. The first material can comprise III-nitride material that form a nucleation layer on a substrate, a buffer layer, an insulating buffer layer, a insulating high voltage buffer layer, a back barrier layer, a channel layer, or other material layers that are used to optimize the performance of III-nitride transistors.

An optional epitaxial channel layer can be included in the device structure.

The channel layer can be selected to have a P-type doping concentration that is lower then P-type doping concentration for other layers or regions within the first material or second material so that there is reduce neutral impurity scattering of the hole carriers.

The epitaxial channel layer can be selected to be unintentionally doped (UID) III-nitride epitaxial layer.

The channel layer will be typically adjacent to the barrier layer within the first material for the non-inverted P-channel III-nitride transistor.

The III-nitride barrier layer can for example be AlGaN, InAlN, or InAlGaN epitaxial layer. The III-nitride barrier layer can be tensile strained or can be unstrained. InAlN with approximately 17 percent indium will lattice matched to the GaN in the first material and will not be strained. For the case of an AlGaN barrier layer, the aluminum concentration can be selected to be approximately 30 percent aluminum concentration and a thickness of the AlGaN that range from 5 nm to approximately 40 nm.

There can be one or more P-type dopant layer within the barrier layer. The P-type dopant layers can be delta-doped P-type dopant layer(s). The p-type doped layers within the barrier layer can generate free holes that transport to the 2DHG. The p-type doped layers within the barrier layer can be displaced from the 2DHG to minimize ionized impurity scattering that can reduce the hole mobility in the 2DHG.

Example 2

Outline of Process Steps to Fabricate Non-Inverted P-Channel III-Nitride High Hole Mobility Transistors on a Substrate 1. Select a preferred face or offcut orientation of a silicon, sapphire, SiC, GaN, or AlN substrate so that the nitrogen-polar (001) face is the dominant face that results for growth of III-Nitride material.

2. Optionally grow the nitrogen polar III-nitride epitaxial material in a selected region on a substrate.
   a. Optionally deposit an oxide on a material substrate.
   b. Optionally use photolithography to define an opening in the oxide to the substrate.
   c. Optionally selectively epitaxially grow the first nitrogen-polar III-Nitride material in the oxide opening using MOCVD epitaxial growth approach.
   d. Optionally the epitaxial layer to form an Non-Inverted P-channel III-Nitride High Hole Mobility Transistors in a selected region of a substrate in at least the gate region, and portions of the source or drain region of the P-channel field effect transistor.

3. Grow AlN, AlGaN, or GaN nucleation layer on a sapphire, SiC, silicon, GaN, AlN substrate in such a manner that the nitrogen-polar (0001) face is the dominant face for growth of III-Nitride epitaxial layer growth material.

4. Grow GaN epitaxial layer by MOCVD, MBE, or atomic layer epitaxy on nitrogen-polar (0001) III-nitride nucleation layer. The GaN epitaxial layer will be typically grown to a thickness sufficient that the GaN epitaxial layer is entirely or partially relaxed. The GaN epitaxial layer can be doped entirely with P-type dopant (typically magnesium) or it can contain one or more P-type doped layers within the GaN epitaxial layer, included delta-doped P-type epitaxial layer. The p-type doped layers within the GaN can be displaced from the 2DHG to minimize ionized impurity scattering that can reduce the hole mobility in the 2DHG.

5. Optionally grow a back barrier layer that would typically be an AlGaN epitaxial layer or InAlN epitaxial layer to obtain improved confinement of holes in the 2DHG or to increase the threshold voltage of the transistor. The back barrier can have P-type doped layers within the back barrier. The p-type doped layers within the back barrier can be displaced from the 2DHG to minimize ionized impurity scattering that can reduce the hole mobility in the 2DHG.

6. Optionally grow one or more P-type dopant layer within the first material. The P-type dopant layers can be delta-doped P-type dopant layer(s). The p-type doped layers within the first material can be displaced from the 2DHG to minimize ionized impurity scattering that can reduce the hole mobility in the 2DHG.

7. Optionally grow a channel layer. The channel layer can be doped P-type but in the case that the channel layer is doped P-type, it is desirable that the P-type doping have a low concentration to minimize the effect of neutral impurity scattering on the hole mobility in the 2DHG. The channel layer can also be unintentionally doped (UID) or doped with a low n-type concentration. The thickness of the channel layer can be selected so that the 2DHG is significantly within the channel layer.

8. Optionally grow a thin (approximately 1 nm) III-nitride spacer layer to reduce the effects of alloy scattering from the teranary barrier material on the mobility of the holes in the 2DHG.

9. Grow an III-nitride epitaxial barrier layer. The III-nitride barrier layer can for example be AlGaN, InAlN, or InAlGaN epitaxial layer. The III-nitride barrier layer can be tensile strained or can be unstrained. InAlN with approximately 17 percent indium will lattice matched to the GaN in the first material and will not be strained. For the case of an AlGaN barrier layer, the aluminum concentration can be selected to be approximately 30 percent aluminum concentration and a thickness of the AlGaN that range from 5 nm to approximately 40 nm. Optionally grow one or more P-type dopant layer within the barrier layer. The P-type dopant layers can be delta-doped P-type dopant layer(s).

The p-type doped layers within the barrier layer can be displaced from the 2DHG to minimize ionized impurity scattering that can reduce the hole mobility in the 2DHG.
10. Optionally grow a GaN capping layer.
11. Optionally grow in-situ silicon nitride layer (range of thickness of 0.2 nm to 100 nm).
12. For the case that a buried magnesium ion implant within the first material is formed, grow an AlN capping layer.
13. Optionally perform a magnesium ion implant at an energy such that the peak of the magnesium ion implant is below the region of the 2DHG.
14. Optionally anneal the magnesium ion implant. A candidate anneal approach is the multicycle rapid thermal anneal approach.
15. Optionally chemically selective etch the AlN cap layer and stop at the GaN cap layer or the AlGaN barrier layer.
16. Optionally deposit an silicon nitride, aluminum nitride, or diamond layer.
17. Optional photolithography step to define to contact window and etch through the silicon nitride, aluminum nitride, or diamond layer if present.
18. Optional etch through the GaN cap layer and the barrier layer. The Au/Ni metal alloy that can be used to form ohmic contact to the 2DHG has little to no spiking of the metal into the semiconductor during the ohmic contact anneal and thus, reduced contact resistance can be obtained by etching the GaN cap layer and the barrier layer so that the Au/Ni metal can be in direct contact with the 2DHG. The Au/Ni metal system for ohmic contact is non spiking but it is an alloyed contact alloyed.
19. The GaN can be etched with high selectivity to etching AlN using for example RIE O2/Cl2/Ar etch with 48:1 selectivity. One approach to etching through the barrier layer with high accuracy is to use digital etching techniques involving a pulsed etch followed by a plasma oxidation process can be used to etch through the barrier layer.
20. Photolithography step and metal liftoff for source/drain ohmic contact formation including anneal for ohmic contact formation.
21. Perform device isolation by oxygen or proton ion implant or alternately by etching a mesa through the barrier material layer.
22. Optionally etch a recess through the GaN cap layer and optionally partially into the barrier layer.
23. Chemical clean followed by optional plasma nitrogen or rapid thermal nitrogen anneal.
24. Optionally deposit first insulator layer consisting of $Al_2O_3$, HfO2, Gd2O3, Sc2O3, Silicon Nitride, Silicon Oxide, other metal oxide layer or combination of dielectric material layers.
25. Optionally deposit second insulator layer that can be used to implement gate field plate.
26. Photolithography to define gate opening in second insulator layer if the second insulator layer is present.
27. Deposit and define gate metal (Schottky gate metal if metal in direct contact with semiconductor). The gate metal can be designed to overlap the edges of the etched recess opening or alternately be designed to be inside the edges of the gate opening. The process of forming the gate metal can include forming a T-gate using process steps known to those skilled in the art.
28. Photolithography to make a contact window through first insulator layer to ohmic contact metal if first insulator layer is deposited after ohmic metal formation.
29. Optional device isolation by etching or implant (if not performed at an earlier step).
30. Deposit and define thick metal.

Example 3

Optional Regrown Source and Drain for Non-Inverted P-Channel III-Nitride Field Effect Transistor The discussion below is appropriate for both a normally-on and a normally-off Non-Inverted P-type III-nitride field effect transistors.

To make a P-channel III-nitride field effect transistor, it is important that there be a source of free holes that supply free holes to the 2DHG that is located at the heterointerface between the barrier layer and the first material. A P-type doped contact layer can be used to make an electrical connection between the source and drain metal electrode and the 2DHG at the interface between the barrier layer and the first material.

One approach to implement a P-type doped contact layer that makes an electrical connection from the drain metal electrode to the two-dimensional hole gas (2DHG) that is located at the heterointerface between the barrier layer and the first material is to etch contact recess in the III-nitride material in a contact region to or slightly beyond the heterointerface (into the first material) so that a direct electrical connection is form to the 2DHG that is located at the heterointerface and then grow (deposit) a P-type semiconductor material in the contact recess in the contact region in such a manner that there is direct electrical contact between the P-type doped contact layer and the 2DHG.

The sheet resistance of the P-type doped contact layer is preferably less than the sheet resistance of the 2DHG. For a non-inverter III-Nitride High Electron Mobility Transistor, the 2DHG will form on the bottom side (side closes to the substrate) of the barrier layer. The P-type doped contact layer in a contact recess in the contact region that functions as the source and drain connection to the 2DHG. In addition, the P-type doped contact layer is preferably selected to provide a low contact resistance to the metal that is used for the source and drain electrode contacts.

Candidate P-type doped contact layer material is a semiconductor material such as P-type doped GaN, InGaN, InN, Ge, InGaAs, GaAs, InP, GaSb, InGaSb, InP, NiO, InGaAs, ZnO, ZnS, InAs. The semiconductor material can be a single-crystal epitaxial layer, a polycrystalline material, amorphous material, or nanocrystalline material. In many cases, the p-type semiconductor material is a heterojunction material with the underlying III-nitride material. The P-type doped contact layer can be deposited by metal organic chemical vapor deposition (MOCVD), molecular beam epitaxy (MBE), chemical vapor deposition (CVD), Atomic Layer deposition, atomic layer epitaxy, plasma enhanced chemical vapor deposition, vapor deposition, electron-beam, sputtering or other growth technique known to those skilled in the art. The temperature that is used for the growth of the P-doped contact layer material is can be selected for optimized device type. For example, if the gate metal is present during the growth of the P-type doped contact layer, it is preferred that a growth temperature for the P-type doped contact layer be less than approximately 400 C. A low growth temperature for the P-type doped contact layer can enable a self-aligned transistor in which one edge of the contact region for the source is aligned to the gate edge or a dielectric spacer layer that is on edge of the gate and also one edge of the contact region for the drain is aligned to the gate edge or a dielectric spacer layer that is on the edge of the gate.

It is often preferred that the deposited P-type doped contact layer material be selectively grown in the contact region, however, it is also possible that the P-type semiconductor material can be grown in a non-selective approach. For selective P-type doped contact layer growth, the approach that is typically employed is to deposit a non-nucleation material such as silicon oxide or silicon nitride that is resistant to P-type doped contact layer material growth on the surface of the non-nucleation material and then photolithography define and etch the non-nucleation material to the surface of the III-nitride material. The III-nitride material is then etched in the contact region to the 2DHG. The etch to form the contact recesses may be provided by, for example, a wet etch, a dry etch and/or a reactive ion etch or the like. Optionally, the structure may be annealed to remove and/or reduce damage resulting from the etch.

The P-type doped contact layer can have a uniform doping concentration, a graded doping concentration, or one or layers of varying doping within the P-type doped contact layer. For example, the doping concentration in the P-type doped contact layer material that is in contact with the source and drain metal can be chosen to be optimized for low contact resistance. The P-type doped contact layer can consist of one or more semiconductor material types. For example, the P-type doped contact layer semiconductor material that is in contact with the source and drain metal can be chosen for example for low contact resistance for an alloyed ohmic metal contact or alternately for a non-alloyed ohmic metal contact. The semiconductor material in contact with the metal can be selected to provide low semiconductor-metal barrier height, sub-bandgap tunneling, resistance to native oxide formation on semiconductor surface, or easy cleaning process for removal of native oxide on semiconductor surface to achieve low contact resistance. The semiconductor material that is in contact with the metal can be selected to provide stable semiconductor/metal contact or resistance to eutectic formation a reliable semiconductor/metal contact.

Example 4

Self-Aligned Non-Inverted P-Channel High Hole Mobility Transistor with Regrown Source and Drain The self-aligned non-inverted P-channel High Hole Mobility Transistor with Regrown Source and Drain is similar to the process described earlier except that:

The material and growth method selected for the self-aligned P-type doped contact layer is specifically chosen to be at a sufficiently low growth temperature that the growth temperature does not degrade the reliability of the gate metal to semiconductor Schottky junction, the gate metal to insulator to semiconductor junction (metal-insulator-semiconductor junction), and the ohmic metal to semiconductor junction.

A means for achieving electrical isolation between the gate metal and the self-aligned P-type doped contact layer.

The means for achieving electrical isolation between the gate metal and the self-aligned P-type doped contact layer include Forming a dielectric spacer on the side wall of the gate metal (and more commonly a T-gate metal) by depositing a dielectric followed by reactive ion etch for forming a self-aligned spacer as is known to those skilled in the art; and/or Growing a self-aligned P-type doped contact layer material less than the thickness of the contact recess so that there remains a height separation between the surface of the self-aligned P-type doped contact layer and the bottom of the gate metal material.

Example 5

Implanted Source and Drain for Non-Inverted P-Type High Hole Mobility Transistor The discussion below is appropriate for both a normally-on and a normally-off Non-Inverted P-type High Hole Mobility Transistor.

To make a P-type High Hole Mobility Transistor, it is important that there be a source of free holes that supply free holes to the 2DHG that is located at the heterointerface between the barrier layer and the first material. A P-type doped contact layer can be used to make an electrical connection between the source and drain metal electrode and the 2DHG at the interface between the barrier layer and the first material.

One approach to make an electrical connection from the source and drain metal electrode to the two-dimensional hole gas (2DHG) that is located at the heterointerface between the barrier layer and the first material is form an implanted P-type implanted layer that extends from the III-nitride surface in the contact region to or slightly beyond the slightly beyond the heterointerface (into the first material) so that a direct electrical connection is form to the 2DHG that is located at the heterointerface. Because of the anneal temperature required to activate P-type dopant in III-nitride material is very high, the implant and anneal must be performed prior to the gate formation.

An AlN cap layer is typically needed on the surface of the III-Nitride material to prevent the surface from decomposing during a high temperature anneal.

An approach of implanting and activating a P-type dopant in GaN is described elsewhere. After the implant anneal has been performed, the AlN capping layer can optionally be etched from the surface of the III-Nitride material. A chemical selective etch can be used to etch the AlN cap layer as described elsewhere.

Example 6

Non-Inverted Normally-Off P-Type High Hole Mobility Transistor

A number device implementations have been described in the literature for achieving normally-off operation for non-inverted (normal) III-Nitride FET devices. A common approach is to recess (thin) the III-Nitride barrier material in the region where the gate will be formed. This approach of recessing (thinning) the III-Nitride barrier material can also be use to implement normally-off non-inverted P-channel III-Nitride FET. An example of an embodiment that can achieve normally-off operation for a non-inverted III-Nitride FET that uses selective etching to achieve an ultrathin barrier material layer is discussed in "Transistor with Enhanced Channel Charge Inducing Material Layer and Threshold Voltage Control" U.S. patent application Ser. No. 12/823,210. The device structure discussed in U.S. patent application Ser. No. 12/823,210 can also be used to achieve normally-off non-inverted P-channel III-Nitride FET.

Examples of the types of III-Nitride Field Effect Transistors include High Electron Mobility Transistor (HEMT), a HIGFET, a MOSHEMT, a MOSFET, etc.

Example 7

Inverted P-Channel High Hole Mobility Transistor

In the first device structure implementation, Inverted P-channel III-Nitride High Hole Mobility Transistors are implemented (fabricated) on a gallium-polar (gallium face) III-Nitride material grown epitaxially on a material substrate. The gallium-polar III-Nitride material can comprise of one or more III-Nitride epitaxial material layers grown in such a manner that when GaN is epitaxially grown (and other III-Nitride epitaxial layers), the top surface of the epitaxial layer is gallium-polar (gallium-face). The material substrate can be selected for optimizing the epitaxial growth of gallium-polar III-Nitride material or optimizing the thermal conductivity. Typical material substrate for gallium polar epitaxial layer are sapphire, 6H-SiC, 4H-SiC, and silicon with a (111) orientation. A gallium nitride bulk substrate can be used with the gallium-polar surface selected for epitaxial growth of the gallium-polar III-Nitride material. There are other material substrates known to those skilled in the art that can be used to grow gallium polar material.

Example 8

Inverted P-Channel III-Nitride High Hole Mobility Transistors

In a first device structure embodiment, Inverted P-channel III-nitride field effect transistor with hole carriers in the channel are fabricated on a gallium-polar (gallium face) III-Nitride material grown epitaxially on a substrate. For the purposes of this disclosure, inverted means that the two-dimensional hole gas at the heterointerface is on the side of the barrier material layer that is closest to the substrate (bottom side of the barrier layer).

The inverted P-channel III-nitride transistor with hole carriers in the channel can be an inverted P-channel III-Nitride High Hole Mobility Transistors The gallium-polar III-Nitride first material can comprise of one or more III-Nitride epitaxial material layers grown in such a manner that when GaN is epitaxially grown, the top surface of the epitaxial layer is gallium-polar (gallium-face).

The substrate can be selected for optimizing the epitaxial growth of gallium-polar III-Nitride epitaxial layers. For example, a sapphire substrate with AlN nucleation layer is known to facilitate the growth of gallium-polar III-Nitride epitaxial layers. A gallium nitride bulk substrate can be used with the gallium-polar surface selected for epitaxial growth of the gallium-polar III-Nitride epitaxial layers. The SiC silicon face substrate with AlN nucleation layer can be used to grow gallium polar III-nitride epitaxial material. The silicon (111) orientation with AlN nucleation layer can be used to grow gallium polar III-nitride epitaxial material. There are other substrates known to those skilled in the art that can be selected to grow gallim polar III-nitride epitaxial layers.

The Inverted P-channel III-Nitride High Hole Mobility Transistors will have a two-dimensional hole gas (2DHG) at a heterointerface on the bottom side (side of the barrier layer closest to the substrate) of a barrier layer.

The 2DHG will be at the heterointerface of a barrier material layer and a second material and is located on bottom side of the barrier layer. P-type doped layer or layers can aid optimizing the band diagram within the III-nitride material that so that the valence band maximum at the heterointerface where the 2DHG is located is at a potential that is higher than the quasi-Fermi level for zero bias applied to the gate electrode.

The can be one or more P-type layers within the first material or P-type ion implanted layers or regions. There can be optional P-type dopant hole carrier generation layer(s) or region(s) such as III-nitride material doped with magnesium incorporated within the entire second material, as one or more delta doped P-type layer(s) within first material, partially within one or more of the epitaxial layers within the first material, or entirely within one of the epitaxial layers within the first material. The P-type dopant hole generation layer performs as a modulation-doping source to aid in providing (generating) free hole carriers that transport to the two-dimensional hole gas.

The second material can consist of one or more III-nitride epitaxial layers. The first material can comprise III-nitride material that form a nucleation layer on a substrate, a buffer layer, an insulating buffer layer, a insulating high voltage buffer layer, a back barrier layer, a channel layer, or other material layers that are used to optimize the performance of III-nitride transistors.

An optional epitaxial channel layer can be included in the device structure. The channel layer located within the first material can be selected to have a P-type doping concentration that is lower than P-type doping concentration for other layers or regions within the second material or first material so that there is reduce neutral impurity scattering of the hole carriers.

The epitaxial channel layer located within the first material can be selected to be unintentionally doped (UID) III-nitride epitaxial layer.

The channel layer will be typically adjacent to the barrier layer within the first material for the inverted P-channel III-nitride transistor.

The III-nitride barrier layer can for example be GaN, AlGaN, InAlN, or InAlGaN epitaxial layer. The III-nitride barrier layer can be tensile strained or can be unstrained.

InAlN with approximately 17 percent indium will lattice matched to the GaN in the first material and will not be strained. For the case of a GaN barrier layer, the thickness of the GaN that range from 5 nm to approximately 40 nm.

Optionally grow one or more P-type dopant layer within the barrier layer. The P-type dopant layers can be delta-doped P-type dopant layer(s). The p-type doped layers within the barrier layer can be displaced from the 2DHG to minimize ionized impurity scattering that can reduce the hole mobility in the 2DHG.

Example 9

Outline of Process Steps to Fabricate Inverted P-Channel III-Nitride High Hole Mobility Transistors on a Substrate 1. Select a preferred face or offcut orientation of a silicon, sapphire, SiC, GaN, or AlN substrate so that the gallium-polar (0001) face is the dominant face that results for growth of III-Nitride material.
2. Approach 1 Optionally grow the gallium polar III-nitride epitaxial material in a selected region on a gallium polar GaN substrate or template substrate.
   a. Optionally deposit an oxide on a material substrate.
   b. Optionally use photolithography to define an openings in the oxide to the substrate.

c. Optionally selectively epitaxially grow the first gallium-polar III-Nitride material in the oxide opening using MOCVD epitaxial growth approach.

d. Optionally grow the epitaxial layer to form an Inverted P-channel III-Nitride High Hole Mobility Transistors in a selected region of a substrate in at least the gate region, and portions of the source or drain region of the P-channel field effect transistor.

Approach 2 For Nitrogen polar GaN substrate, sapphire substrate, SiC substrate, or silicon substrate, grow a thin AlN polarity inversion layer/nucleation layer.

a. Optionally deposit an oxide on substrate having AlN layer polarity inversion layer/nucleation layer.

b. Optionally use photolithography to define an openings in the oxide to the substrate.

c. Optionally selectively epitaxially grow the first gallium-polar III-Nitride material in the oxide opening using MOCVD epitaxial growth approach.

d. Optionally grow the epitaxial layer to form an Inverted P-channel III-Nitride High Hole Mobility Transistors in a selected region of a substrate in at least the gate region, and portions of the source or drain region of the P-channel field effect transistor.

3. Grow AlN, AlGaN, or GaN nucleation layer on a sapphire, SiC, silicon, GaN, AlN substrate in such a manner that the gallium-polar (0001) face is the dominant face for growth of III-Nitride epitaxial layer growth material.

4. Grow optional GaN epitaxial layer by MOCVD, MBE, or atomic layer epitaxy on gallium-polar (0001) III-nitride nucleation layer.

5. Grow optional epitaxial layer that optimize doping for a compensation layer. The goal of the composition layer is to reduce or eliminate a two-dimensional electron gas that can form heterointerface of GaN and an barrier layer. An optional one or more P-type dopant layer(s) incorporated near or at the heterointerface of the barrier layer that is closest to the substrate can be used to reduce the carrier density or eliminate the 2DEG.

6. Grow an III-nitride epitaxial barrier layer. The III-nitride barrier layer can for example be AlGaN, InAlN, or InAlGaN epitaxial layer. The III-nitride barrier layer can be tensile strained or can be unstrained. InAlN with approximately 17 percent indium will lattice matched to the GaN in the first material and will not be strained. For the case of an AlGaN barrier layer, the aluminum concentration can be selected to be approximately 30 percent aluminum concentration and a thickness of the AlGaN that range from 5 nm to approximately 40 nm. Optionally grow one or more P-type dopant layer within the barrier layer. The P-type dopant layers can be delta-doped P-type dopant layer(s). The p-type doped layers within the barrier layer can be displaced from the 2DHG to minimize ionized impurity scattering that can reduce the hole mobility in the 2DHG.

7. Optionally grow a thin (approximately 1 nm) III-nitride spacer layer to reduce the effects of alloy scattering from the teranary barrier material on the mobility of the holes in the 2DHG.

8. Optionally grow a channel layer. The channel layer can be doped P-type but in the case that the channel layer is doped P-type, it is desirable that the P-type doping have a low concentration to minimize the effect of neutral impurity scattering on the hole mobility in the 2DHG. The channel layer can also be unintentionally doped (UID) or doped with a low n-type concentration. The thickness of the channel layer can be selected so that the 2DHG is significantly within the channel layer 9. Optionally grow one or more P-type dopant layer within the second material. The P-type dopant layers can be delta-doped P-type dopant layer(s). The p-type doped layers within the second material can be displaced from the 2DHG to minimize ionized impurity scattering that can reduce the hole mobility in the 2DHG.

10. Optionally grow a III-nitride cap layer. The cap layer will typically be GaN to provide improved surface passivation properties.

11. Optionally grow in-situ silicon nitride layer (range of thickness of 0.2 nm to 100 nm).

12. For the case that a buried magnesium ion implant within the first material is formed, grow an AlN capping layer.

13. Optionally perform a magnesium ion implant at an energy such that the peak of the magnesium ion implant is below the region of the 2DHG.

14. Optionally anneal the magnesium ion implant. A candidate anneal approach is the multicycle rapid thermal anneal approach.

15. Optionally chemically selective etch the AlN cap layer and stop at the GaN cap layer or the AlGaN barrier layer.

16. Optionally deposit a silicon nitride, aluminum nitride, or diamond layer.

17. Optional photolithography step to define to contact window and etch through the silicon nitride, aluminum nitride, or diamond layer if present.

18. Optional etch through the GaN cap layer and first material layer. The Au/Ni metal alloy that can be used to form ohmic contact to the 2DHG has little to no spiking of the metal into the semiconductor during the ohmic contact anneal and thus, reduced contact resistance can be obtained by etching the GaN cap layer and the barrier layer so that the Au/Ni metal can be in direct contact with the 2DHG. The Au/Ni metal system has little or no spiking, but it is alloyed. The GaN can be etched with high selectivity to etching AlN using for example RIE O2/Cl2/Ar etch with 48:1 selectivity. One approach to etching through the first material with high accuracy is to use digital etching techniques involving a pulsed etch followed by a plasma oxidation process can be used to etch through the barrier layer.

19. Photolithography step and metal liftoff for source/drain ohmic contact formation including anneal for ohmic contact formation.

20. Perform device isolation by oxygen or proton ion implant or alternately by etching a mesa through the barrier material layer.

21. Optionally etch a recess through the GaN cap layer and optionally partially into the barrier layer.

22. Chemical clean followed by optional plasma nitrogen or rapid thermal nitrogen anneal.

23. Optionally deposit first insulator layer consisting of $Al_2O_3$, HfO2, Gd2O3, Sc2O3, Silicon Nitride, Silicon Oxide, other metal oxide layer or combination of dielectric material layers.

24. Optionally deposit second insulator layer that can be used to implement gate field plate.

25. Photolithography to define gate opening in second insulator layer if the second insulator layer is present.

26. Deposit and define gate metal (Schottky gate metal if metal in direct contact with semiconductor). The gate metal can be used designed to overlap the edges of the etched recess opening or alternately be designed to be inside the edges of the gate opening. The process of forming the gate metal can include forming a T-gate using process steps known to those skilled in the art.

27. Photolithography to make a contact window through first insulator layer to ohmic contact metal if first insulator layer is deposited after ohmic metal formation.
28. Optional device isolation by etching or implant (if not performed at an earlier step).
29. Deposit and define thick metal.

In addition, the optional P-type doping can be within the barrier layer or can be an optional delta-doped layer within the barrier layer. The second material can consist of one or more III-nitride epitaxial layers. If the second material is too thin, a 2DHG will not form at the heterointerface between the barrier layer and the second material. An example of a second material that can allow a 2DHG to from at the heterointerface of the barrier layer and the second material is a second material that consist of approximately 20 nm of GaN or thicker GaN layer.

Example 10

Regrown Source and Drain for Inverted P-Channel High Hole Mobility Transistor

An inverted P-type High Hole Mobility Transistor is formed on III-Nitride material that have a gallium-polar surface. The 2DHG is formed at the heterointerface between the barrier layer and a second material on the topside of the barrier layer (the side of the barrier layer that is away from the substrate).

The discussion below is appropriate for both a normally-on and a normally-off Inverted P-type High Hole Mobility Transistor.

To make a P-type High Hole Mobility Transistor, it is important that there be a source of free holes that supply free holes to the 2DHG that is located at the heterointerface between the barrier layer and the second material. A P-type doped contact layer can be used to make an electrical connection between the source and drain metal electrode and the 2DHG at the interface between the barrier layer and the second material.

One approach to implement a P-type doped contact layer that makes an electrical connection from the drain metal electrode to the two-dimensional hole gas (2DHG) that is located at the heterointerface between the barrier layer and the second material is to etch contact recess in the III-nitride material in a contact region to or slightly beyond the heterointerface (into the barrier layer) so that a direct electrical connection is form to the 2DHG that is located at the heterointerface and then grow (deposit) a P-type semiconductor material in the contact recess in the contact region in such a manner that there is direct electrical contact between the P-type doped contact layer and the 2DHG. It is important that the etch in the contact recess in the contact region not extend too far into the barrier layer.

There is a two-dimensional electron gas (2DEG) at the heterointerface between the barrier layer and the first material. It is important that the P-type contact layer not extend through the barrier layer and make an electrical connection to the 2DEG. It can also be preferred that a non-alloyed metal ohmic contact be implemented to that there is not metal spiking that extends from the P-type doped contact layer surface to the 2DEG. The barrier layer can be designed to be thicker then normal to help prevent the alloy spiking that contact the 2DEG.

The remaining discussion for how to make electrical connection to the 2DHG on the top side of the barrier layer at the heterointerface between the barrier layer and the second material is the same as discussed in section I.A.

Example 11

Self-Aligned Inverted P-Channel High Hole Mobility Transistor with Regrown Source and Drain The approach for a Self-Aligned Inverted P-Channel High Hole Mobility Transistor with Regrown Source and Drain is the same as discussed earlier.

Example 12

Implanted Source and Drain for Inverted P-Channel High Hole Mobility Transistor

An inverted P-type High Hole Mobility Transistor is formed on III-Nitride material that have a gallium-polar surface. The 2DHG is formed at the heterointerface between the barrier layer and a second material on the topside of the barrier layer (the side of the barrier layer that is away from the substrate).

The discussion below is appropriate for both a normally-on and a normally-off Inverted P-type High Hole Mobility Transistor.

To make a P-type High Hole Mobility Transistor, it is important that there be a source of free holes that supply free holes to the 2DHG that is located at the heterointerface between the barrier layer and the second material. A P-type doped contact layer can be used to make an electrical connection between the source and drain metal electrode and the 2DHG at the interface between the barrier layer and the second material.

One approach to make an electrical connection from the source and drain metal electrode to the two-dimensional hole gas (2DHG) that is located at the heterointerface between the barrier layer and the first material is form an implanted P-type implanted layer that extends from the III-nitride surface in the contact region to or slightly beyond the slightly beyond the heterointerface (into the first material) so that a direct electrical connection is form to the 2DHG that is located at the heterointerface between the barrier layer and the second material.

The remaining discussion of the approach for forming an implanted P-type doped contact layer is the same as discussed earlier.

Example 13

Epitaxial Grown Raised Source and Drain for Inverted P-Channel High Hole Mobility Transistor The discussion below is appropriate for both a normally-on and a normally-off Non-Inverted P-type High Hole Mobility Transistor.

To make a P-type High Hole Mobility Transistor, it is important that there be a source of free holes that supply free holes to the 2DHG that is located at the heterointerface between the barrier layer and the first material. The first epitaxial layer can be doped p-type to provide a source of holes for the 2DHG. A P-type doped raised contact layer can be used to supply free holes to the 2DHG at the interface between the barrier layer and the second material.

An alloyed metal that spikes to the 2DHG is used to provide the ohmic electrical connection from the source and drain metal to the 2DHG.

The P-type doped raised contact layer is preferably formed by epitaxially growing a P-type doped GaN epitaxial layer. The P-type doped raised contact layer can also be additional P-type semiconductor layer such as ZnO and other wide bandgap P-type semiconductor layers that can supply holes to the 2DHG. The P-type doped raised contact layer can be formed by selective growth or by subtractive etching. The P-type doped raised contact layer can be larger than the ohmic metal area size.

Example 14

Inverted Normally-Off P-Type High Hole Mobility Transistor

The approach to achieve normally-off operation for an Inverted P-channel III-Nitride FET is to incorporated a compensating III-Nitride epitaxial material such as AlGaN, AlN, InAlN, or AlInGaN epitaxial layer (or a stacked sequence of III-nitride epitaxial materials) on top of the III-Nitride epitaxial channel layer (typically a GaN epitaxial layer) in the area beneath the gate (or gate region) that completely or partially compensates (cancels) the spontaneous polarization and/or piezoelectric polarization induced two-dimensional hole gas at the top side of the III-Nitride barrier material (i.e., at the interface between the channel III-Nitride epitaxial layer and the III-Nitride barrier material layer).

The compensating III-Nitride epitaxial material can comprise AlGaN, AlN, InAlN, or AlInGaN epitaxial layer (or a stacked sequence of III-nitride epitaxial materials).

The two-dimensional hole will have a high carrier density in the III-Nitride epitaxial channel layer in those regions where the compensating III-Nitride epitaxial material is not on top of the III-Nitride epitaxial channel layer. Thus, those regions can have low source and drain access resistance.

The compensating III-Nitride epitaxial material will preferably be beneath the gate or gate region but not extend laterally significantly into the source or drain access region in order to allow a low source and drain access resistance. The compensating III-Nitride epitaxial material can be self-aligned to the gate or preferably extend less than 1.0 microns into the source or drain access region.

The thickness of the III-Nitride epitaxial channel layer is selected so that a 2DHG is formed but not so thick that a 2DEG can be formed within the III-Nitride epitaxial channel layer. The III-Nitride epitaxial channel layer will typically consist of a GaN epitaxial layer and have a thickness of approximately 20 nm.

The III-Nitride FET can incorporate an insulating dielectric beneath the gate to reduce the gate leakage current and allow applying a bias between the gate and source without leakage.

Example 15

Outline of Process Steps to Fabricate Regrown Source and Drain Non-Inverted (Normal) P-Channel III-Nitride High Hole Mobility Transistors on a Substrate 1. Self a particular face or offcut orientation of a silicon, sapphire, SiC, GaN, or AlN substrate so that the nitrogen-polar (001) face is the dominant face for growth of III-Nitride material or alternately grow AlN, AlGaN, or GaN nucleation layer on a silicon, sapphire, SiC, GaN, or AlN substrate in such a manner that the nitrogen-polar (001) face is the dominant face for growth of III-Nitride material.

a. Optionally form Non-Inverted (Normal) P-channel III-Nitride High Hole Mobility Transistors in a selected region of a substrate.
   b. Optionally deposit an oxide on a material substrate.
   c. Optionally use photolithography define an openings in the oxide to the material substrate.
   d. Optionally selectively epitaxially grow the first nitrogen-polar III-Nitride material in the oxide opening using MOCVD.
2. Epitaxially grow one or more nitrogen-polar III-Nitride epitaxial material layers on the material substrate where one of more of the epitaxial growth layers form the first material, one or more of the epitaxial growth layers form the barrier layer, and optionally, one or more of the epitaxial layers form a cap layer on the surface of the barrier layer.
3. Deposit a nucleation resistant material such as silicon oxide or silicon nitride on surface of the III-nitride epitaxial layers.
4. Optionally deposit a metal layer on the surface of the nucleation resistant material layer that can help protect the nucleation resistant material layer from etch during the reactive ion etching of III-nitride material layer.
5. Perform a photolithography step to define the contact region.
6. Optionally etch the metal layer and then etch the nucleation resistant material to the III-nitride material surface.
7. Remove the photolithography resist material and use the metal layer or the nucleation resist material as etch resistant material for defining the contact region where III-nitride material will be etched.
8. Use reactive ion etching to etch the contact recess in the III-nitride material in a contact region through the barrier layer to or slightly beyond the heterointerface (into the first material) so that a direct electrical connection is formed to the 2DHG that is located at the heterointerface.
9. Selectively grow (deposit) a P-type doped contact layer semiconductor material in the contact recess in the contact region in such a manner that there is direct electrical contact between the P-type doped contact layer and the 2DHG. The P-typed doped contact layer semiconductor material preferably does not grow on the surface of the nucleation resistant material.
10. Etch the optional metal layer and etch the nucleation resistant material in such a manner that the surface of the III-nitride material is not degraded.
11. Deposit metal optionally using liftoff procedure and perform a high temperature anneal to form an alloyed contact or a low temperature anneal or no anneal to form a non-alloyed contact.
12. Form the optional insulator beneath the gate, the gate metal, the passivation material on the surface of the III-nitride material, the thick metal contact to the alloyed or non-alloyed ohmic contact, the optional process steps to form a normally-off transistor such as described in U.S. patent application Ser. No. 12/823,210.

Example 16

Outline of Process Steps to Fabricate Self-Aligned Non-Inverted (Normal) P-Channel III-Nitride High Hole Mobility Transistors on a Substrate 1. Self a particular face or offcut orientation of a silicon, sapphire, SiC, GaN, or AlN substrate so that the nitrogen-polar (001) face is the dominant face for growth of III-Nitride material or alternately grow AlN, AlGaN, or GaN nucleation layer on a silicon, sapphire, SiC, GaN, or AlN substrate in such a manner that the nitrogen-polar (001) face is the dominant face for growth of III-Nitride material.
   a. Optionally form Non-Inverted (Normal) P-channel III-Nitride High Hole Mobility Transistors in a selected region of a substrate.
   b. Optionally deposit an oxide on a material substrate.
   c. Optionally use photolithography define an openings in the oxide to the material substrate.
   d. Optionally selectively epitaxially grow the first nitrogen-polar III-Nitride material in the oxide opening using MOCVD.
2. Epitaxially grow one or more nitrogen-polar III-Nitride epitaxial material layers on the material substrate where one of more of the epitaxial growth layers form the first material, one or more of the epitaxial growth layers form the barrier layer, and optionally, one or more of the epitaxial layers form a cap layer on the surface of the barrier layer.
3. Form the metal gate.
4. Form a dielectric spacer on the etch of the gate by depositing a dielectric and then reactive ion etching the dielectric as is known by those skilled in the art.
5. Deposit a nucleation resistant material such as silicon oxide or silicon nitride on surface of the III-nitride epitaxial layers.
6. Optionally deposit a metal layer on the surface of the nucleation resistant material layer that can help protect the nucleation resistant material layer from etch during the reactive ion etching of III-nitride material layer.
7. Perform a photolithography step to define the contact region.
8. Optionally etch the metal layer and then etch the nucleation resistant material to the III-nitride material surface.
9. Remove the photolithography resist material and use the metal layer or the nucleation resist material as etch resistant material for defining the contact region where III-nitride material will be etched.
10. Use reactive ion etching to etch the contact recess in the III-nitride material in a contact region through the barrier layer to or slightly beyond the heterointerface (into the first material) so that a direct electrical connection is formed to the 2DHG that is located at the heterointerface.
11. Selectively grow (deposit) a P-type doped contact layer semiconductor material in the contact recess in the contact region in such a manner that there is direct electrical contact between the P-type doped contact layer and the 2DHG. The P-typed doped contact layer semiconductor material preferably does not grow on the surface of the nucleation resistant material.
12. Etch the optional metal layer and etch the nucleation resistant material in such a manner that the surface of the III-nitride material is not degraded.
13. Deposit metal optionally using liftoff procedure and perform a high temperature anneal to form an alloyed contact or a low temperature anneal or no anneal to form a non-alloyed contact.
14. Form the optional insulator beneath the gate, the gate metal, the passivation material on the surface of the III-nitride material, the thick metal contact to the alloyed or non-alloyed ohmic contact, the optional process steps to form a normally-off transistor such as described in U.S. patent application Ser. No. 12/823,210.

Example 17

Outline of Process Steps to Fabricate Implanted Source and Drain Non-Inverted (Normal) P-Channel III-Nitride High Hole Mobility Transistors on a Substrate 1. Self a particular face or offcut orientation of a silicon, sapphire, SiC, GaN, or AlN substrate so that the nitrogen-polar (001) face is the dominant face for growth of III-Nitride material or alternately grow AlN, AlGaN, or GaN nucleation layer on a silicon, sapphire, SiC, GaN, or AlN substrate in such a manner that the nitrogen-polar (001) face is the dominant face for growth of III-Nitride material.
   a. Optionally form Non-Inverted (Normal) P-channel III-Nitride High Hole Mobility Transistors in a selected region of a substrate.
   b. Optionally deposit an oxide on a material substrate.
   c. Optionally use photolithography define an openings in the oxide to the material substrate.
   d. Optionally selectively epitaxially grow the first nitrogen-polar III-Nitride material in the oxide opening using MOCVD.
2. Epitaxially grow one or more nitrogen-polar III-Nitride epitaxial material layers on the material substrate where one of more of the epitaxial growth layers form the first material, one or more of the epitaxial growth layers form the barrier layer, and optionally, one or more of the epitaxial layers form a cap layer on the surface of the barrier layer.
3. Deposit an optional AlN cap layer.
4. Deposit an optional silicon oxide layer that will act as an implant layer for a heated ion implantation.
5. Photolithography define a resist layer and etch silicon oxide implant masking layer in the contact region.
6. Perform magnesium implant that can be optionally performed at approximately 500 C.
7. Anneal to activate magnesium implant in using anneal conditions known to those skilled in the art. A anneal procedure that has achieve high P-type activation of implanted magnesium as described.
8. Etch silicon oxide masking layer.
9. Deposit metal optionally using liftoff procedure and perform a high temperature anneal to form an alloyed ohmic contact or a low temperature anneal or no anneal to form a non-alloyed ohmic contact.
10. Form the optional insulator beneath the gate, the gate metal, the passivation material on the surface of the III-nitride material, the thick metal contact to the alloyed or non-alloyed ohmic contact, the optional process steps to form a normally-off transistor such as described in U.S. patent application Ser. No. 12/823,210.

Example 18

Outline of Process Steps to Fabricate Regrown Source and Drain Inverted P-Channel III-Nitride High Hole Mobility Transistors on a Substrate 1. Select a particular face or offcut orientation of a silicon, sapphire, SiC, GaN, or AlN substrate so that the gallium-polar (001) face is the dominant face for growth of III-Nitride material or alternately grow AlN, AlGaN, or GaN nucleation layer on a silicon, sapphire, SiC, GaN, or AlN substrate in such a manner that the gallium-polar (001) face is the dominant face for growth of III-Nitride material.
   e. Optionally form Non-Inverted (Normal) P-channel III-Nitride High Hole Mobility Transistors in a selected region of a substrate.
   f. Optionally deposit an oxide on a material substrate.
   g. Optionally use photolithography define an openings in the oxide to the material substrate.
   h. Optionally selectively epitaxially grow the first nitrogen-polar III-Nitride material in the oxide opening using MOCVD.
2. Epitaxially grow one or more nitrogen-polar III-Nitride epitaxial material layers on the material substrate where one of more of the epitaxial growth layers form the first material, one or more of the epitaxial growth layers form the barrier layer, and optionally, one or more of the epitaxial layers form a cap layer on the surface of the barrier layer. The GaN cap layer on the surface.
3. Deposit a nucleation resistant material such as silicon oxide or silicon nitride on surface of the III-nitride epitaxial layers.
4. Optionally deposit a metal layer on the surface of the nucleation resistant material layer that can help protect the nucleation resistant material layer from etch during the reactive ion etching of III-nitride material layer.
5. Perform a photolithography step to define the contact region.
6. Optionally etch the metal layer and then etch the nucleation resistant material to the III-nitride material surface.
7. Remove the photolithography resist material and use the metal layer or the nucleation resist material as etch resistant material for defining the contact region where III-nitride material will be etched.
8. Use reactive ion etching to etch the contact recess in the III-nitride material in a contact region through the barrier layer to or slightly beyond the heterointerface (into the barrier layer) so that a direct electrical connection is formed to the 2DHG that is located at the heterointerface of the second material and the barrier layer.
9. Selectively grow (deposit) a P-type doped contact layer semiconductor material in the contact recess in the contact region in such a manner that there is direct electrical contact between the P-type doped contact layer and the 2DHG. The P-typed doped contact layer semiconductor material preferably does not grow on the surface of the nucleation resistant material.
10. Etch the optional metal layer and etch the nucleation resistant material in such a manner that the surface of the III-nitride material is not degraded.
11. Deposit metal optionally using liftoff procedure and perform a high temperature anneal to form an alloyed contact or a low temperature anneal or no anneal to form a non-alloyed contact.
12. Form the optional insulator beneath the gate, the gate metal, the passivation material on the surface of the III-nitride material, the thick metal contact to the alloyed or non-alloyed ohmic contact in a normal manner that is known to those skilled in the art. A normally off inverted P-channel High Hole Mobility Transistor can be implemented by compensating III-Nitride epitaxial material in epitaxial layers on the top side of the barrier layer as described earlier.

III-Nitride Complementary Field Effect Technology will enable "CMOS like" circuit technology that will have high frequency capability and high voltage operation capability.

The mobility of electrons in 2DEG can be as high as 2000 V/cm-s and the mobility of holes in a 2DHG can be as high as approximately 500 V/cm-s.

These mobility values are significantly higher then the mobility for electrons and holes in silicon MOS structures.

High voltage III-Nitride complementary circuit is possible because of the factor of ten high break down field for GaN than for silicon.

A complementary circuit technology is also advantage for power integrated circuits (PIC) because a the availability of a P-channel upper level transistor in a half-bridge can be driven with a single gate driver compared to a required two-gate drivers if the P-channel transistor is not available.

Obviously, many modifications and variations are possible in light of the above teachings. It is therefore to be understood that the claimed subject matter may be practiced otherwise than as specifically described. Any reference to claim elements in the singular, e.g., using the articles "a," "an," "the," or "said" is not construed as limiting the element to the singular. The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been illustrated and/or described with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What is claimed is:

1. An inverted P-channel III-nitride field effect transistor with hole carriers in the channel comprising:
   a gallium-polar III-Nitride barrier material layer grown epitaxially on a substrate;
   a p-type layer or region in the barrier material layer;
   a second material layer;
   a two-dimensional hole gas in the second material at the heterointerface of the barrier material layer; and
   wherein the p-type region in the barrier material layer supplies hole carriers to the two-dimensional hole gas in the second material layer at the heterointerface of the barrier material layer;
   wherein the gallium-polar III-Nitride material comprises one or more III-Nitride epitaxial material layers grown in such a manner that when GaN is epitaxially grown the top surface of the epitaxial layer is gallium-polar;
   wherein p-type doped layers optimize the band diagram within the III-nitride material so that the valence band maximum at the heterointerface where the two dimensional hole gas is located is at a potential that is higher than the quasi-Fermi level for zero bias applied to a gate electrode;
   wherein the two-dimensional hole gas is at a heterointerface on the side of the second layer closest to the barrier material layer; and
   further including a p-type dopant hole carrier generation layer;
   wherein the p-type dopant hole carrier generation layer is a delta doped p-type layer within the second material or is within one or more of the epitaxial layers within the barrier material or is an ion implanted p-type layer.

2. The inverted P-channel III-nitride field effect transistor with hole carriers in the channel of claim 1 wherein the substrate is one selected from the group consisting of a silicon-face SiC substrate, a sapphire substrate with an AlN buffer, and a gallium nitride bulk substrate with the gallium-polar surface selected for epitaxial growth of the nitrogen-polar III-Nitride epitaxial layers.

3. The inverted P-channel III-nitride field effect transistor with hole carriers in the channel of claim 2 wherein the P-type dopant hole carrier generation layer is a III-nitride material doped with magnesium.

4. The inverted P-channel III-nitride field effect transistor with hole carriers in the channel of claim 3 wherein the barrier material comprises one or more III-nitride epitaxial layers.

5. The inverted P-channel III-nitride field effect transistor with hole carriers in the channel of claim 4 wherein the barrier material comprises III-nitride material that forms a nucleation layer on the substrate, a buffer layer, an insulating buffer layer, a insulating high voltage buffer layer, a back barrier layer, or a channel layer.

6. The inverted P-channel III-nitride field effect transistor with hole carriers in the channel of claim 5 further including an epitaxial channel layer.

7. The inverted P-channel III-nitride field effect transistor with hole carriers in the channel of claim 6 wherein the channel layer is selected to have a P-type doping concentration that is lower then P-type doping concentration for other layers within the barrier material so that there is reduced neutral impurity scattering of the hole carriers.

8. The inverted P-channel III-nitride field effect transistor with hole carriers in the channel of claim 7 wherein the epitaxial channel layer is selected to be an unintentionally doped III-nitride epitaxial layer.

9. The inverted P-channel III-nitride field effect transistor with hole carriers in the channel of claim 8 wherein the III-nitride barrier material layer is one selected from the group consisting of AlGaN layer, InAlN layer, and InAlGaN epitaxial layer.

10. The inverted P-channel III-nitride field effect transistor with hole carriers in the channel of claim 9 wherein the InAlN epitaxial layer has about 17 percent indium.

11. The inverted P-channel III-nitride field effect transistor with hole carriers in the channel of claim 10 wherein the second material layer is GaN layer and has a thickness of from about 5 nm to about 40 nm.

12. The inverted P-channel III-nitride field effect transistor with hole carriers in the channel of claim 11 wherein the two dimensional hole gas is a carrier layer at the heterointerface of a smaller bandgap material with a wider bandgap material and contains a sheet hole concentration in excess of $10^{13}$ carriers/$cm^2$.

13. A method of making an inverted P-channel III-nitride field effect transistor with hole carriers in the channel comprising:
selecting a face or offcut orientation of a silicon, sapphire, SiC, GaN, or AlN substrate so that the gallium-polar (0001) face is the dominant face that results for growth of III-Nitride material;
growing a AlN, AlGaN, or GaN nucleation layer on the silicon, sapphire, SiC, GaN, or AlN substrate in such a manner that the gallium-polar (0001) face is the dominant face for growth of III-Nitride epitaxial layer growth material;
growing a III-nitride epitaxial layer by MOCVD, MBE, or atomic layer epitaxy on the gallium-polar (0001) III-nitride nucleation layer;
doping the III-nitride epitaxial layer;
growing a GaN epitaxial barrier layer;
etching the GaN;
forming a source/drain ohmic contact;
performing device isolation by oxygen or proton ion implant or alternately by etching a mesa through a second material layer;
defining a gate opening in a second insulator layer if the second insulator layer is present;
depositing and defining gate metal;
performing a photolithography step by adding a photolithography resist material to define the contact region;
removing the photolithography resist material and using the metal layer or the nucleation resist material as etch resistant material for defining the contact region for the III-nitride material;
making a contact window through a first insulator layer to ohmic contact metal if first insulator layer is deposited after ohmic metal formation; and
depositing and defining a thick metal.

14. A method of making an inverted P-channel III-nitride field effect transistor with hole carriers in the channel comprising:
selecting a particular face or offcut orientation of a silicon, sapphire, SiC, GaN, or AlN substrate so that the gallium-polar (0001) face is the dominant face for growth of III-Nitride material or alternately grow AlN, AlGaN, or GaN nucleation layer on a silicon, sapphire, SiC, GaN, or AlN substrate in such a manner that the gallium-polar (0001) face is the dominant face for growth of III-Nitride material;
growing epitaxially one or more gallium-polar III-Nitride epitaxial material layers on the material substrate where one of more of the epitaxial growth layers form a barrier material, one or more of the epitaxial growth layers form a barrier layer, and optionally, one or more of the epitaxial layers form a cap layer on the surface of the barrier layer; forming a metal gate;
forming a dielectric spacer on the edge of the gate by depositing a dielectric and then reactive ion etching the dielectric;
depositing a nucleation resistant material such as silicon oxide or silicon nitride on a surface of the III-nitride epitaxial layers;
performing a photolithography step by adding a photolithography resist material to define the contact region;
removing the photolithography resist material and using the metal layer or the nucleation resist material as etch resistant material for defining the contact region for the III-nitride material;
using reactive ion etching to etch the contact recess in the III-nitride material in a contact region through the barrier layer to or slightly beyond the heterointerface into the barrier material so that a direct electrical connection is formed to the two dimensional hole gas that is located at the heterointerface;
growing or depositing a P-type doped contact layer semiconductor material in the contact recess in the contact region in such a manner that there is direct electrical contact between the P-type doped contact layer and the two dimensional hole gas;
etching an optional metal layer and etching the nucleation resistant material in such a manner that the surface of the III-nitride material is not degraded;
depositing a metal optionally using liftoff procedure and perform a high temperature anneal to form an alloyed contact or a low temperature anneal or no anneal to form a non-alloyed contact; and forming an optional insulator beneath the gate, the gate metal, the passivation material on the surface of the III-nitride material, the thick metal contact to the alloyed or non-alloyed ohmic contact.

15. An inverted P-channel III-nitride field effect transistor with hole carriers in the channel comprising:
- a gallium-polar III-Nitride barrier material layer grown epitaxially on a substrate;
- a second material layer;
- a p-type region in the source and drain regions;
- a two-dimensional hole gas in the second material at the heterointerface of the barrier material layer; and
- wherein the p-type region in the source and drain supplies hole carriers to the two-dimensional hole gas in the barrier material layer at the heterointerface of the second layer;
- wherein the gallium-polar III-Nitride material comprises one or more III-Nitride epitaxial material layers grown in such a manner that when GaN is epitaxially grown the top surface of the epitaxial layer is gallium-polar;
- wherein p-type doped layers optimize the band diagram within the III-nitride material so that the valence band maximum at the heterointerface where the two dimensional hole gas is located is at a potential that is higher than the quasi-Fermi level for zero bias applied to a gate electrode;
- wherein the two-dimensional hole gas is at a heterointerface on the side of the second closest to the barrier material layer; and
- further including a p-type dopant hole carrier generation layer;
- wherein the p-type dopant hole carrier generation layer is a delta doped p-type layer within the second material or is within one or more of the epitaxial layers within the barrier material or is an ion implanted p-type layer.

* * * * *